United States Patent
Harte

[11] 4,142,132
[45] Feb. 27, 1979

[54] METHOD AND MEANS FOR DYNAMIC CORRECTION OF ELECTROSTATIC DEFLECTOR FOR ELECTRON BEAM TUBE

[75] Inventor: Kenneth J. Harte, Carlisle, Mass.

[73] Assignee: Control Data Corporation, Minneapolis, Minn.

[21] Appl. No.: 812,981

[22] Filed: Jul. 5, 1977

[51] Int. Cl.$^2$ ............................................. H01J 29/56
[52] U.S. Cl. ..................................... 315/370; 315/409
[58] Field of Search ............... 315/370, 371, 393, 409; 365/118

[56] References Cited

U.S. PATENT DOCUMENTS

| | | | |
|---|---|---|---|
| 3,491,236 | 1/1970 | Newberry | 365/118 X |
| 3,641,510 | 2/1972 | Chen | 365/118 X |
| 3,961,223 | 6/1976 | Ray et al. | 315/371 |

*Primary Examiner*—Theodore M. Blum
*Attorney, Agent, or Firm*—Charles W. Helzer

[57] ABSTRACT

An electron beam tube electrostatic deflection system and method of operation is described. The electron beam tube includes an eight-fold deflector and means are provided for applying two different quadrupole correction electric potentials to selected ones of the eight-fold deflector members and for applying an octupole correction electrical potential to all eight deflector members. In the preferred embodiment, the quadrupole and octupole correction potentials applied to one set of four deflector members are represented by the respective values $(V_{2c} - \overline{V})$, $(-V_{2c} - \overline{V})$, $(V_{2c} - \overline{V})$ and $(-V_{2c} - \overline{V})$, and the quadrupole and octupole correction potentials applied to the second set of four deflector members are represented respectively by the values $(V_{2s} + \overline{V})$, $(-V_{2s} + \overline{V})$, $(V_{2s} + \overline{V})$ and $(-V_{2s} + \overline{V})$ where the quadrupole correction electric potential $$V_{2c} = [A_{2c}(V_x^2 - V_y^2)]/V_c, \quad (1)$$

the quadrupole correction electric potential $$V_{2s} = (2A_{2s} V_x V_y)/V_c, \quad (2)$$

and the octupole correction potential $\overline{V}$ applied to all eight of the eight-fold deflector members is given by the expression $$\overline{V} = [A_4(V_x^4 - 6V_x^2 V_y^2 + V_y^4)]/4V_c^3 \quad (3)$$

where $A_{2c}$, $A_{2s}$ and $A_4$ are constants, $V_x$ and $V_y$ are the x and y deflection electric potentials, and $-V_c$ is the cathode voltage of the electron gun used in the electron beam tube apparatus. In preferred arrangements, the electrostatic deflection system further includes means for applying a dynamic focusing electric potential to the objective lens assembly of the electron beam tube apparatus in conjunction with both the correction and deflection electric potentials described above. The dynamic focusing electric potential is $$V_{OBJ(DF)} = V_{OBJ(0)} + [(A_{DF}(V_x^2 + V_y^2))/V_c] \quad (4)$$

where $A_{DF}$ is a constant and $V_{OBJ(O)}$ is the uncorrected value of the direct current objective lens supply voltage. Both deflection and correction electric potentials are developed by an eight-fold deflector voltage generator which includes as its heart a novel octupole-quadrupole generator.

63 Claims, 23 Drawing Figures

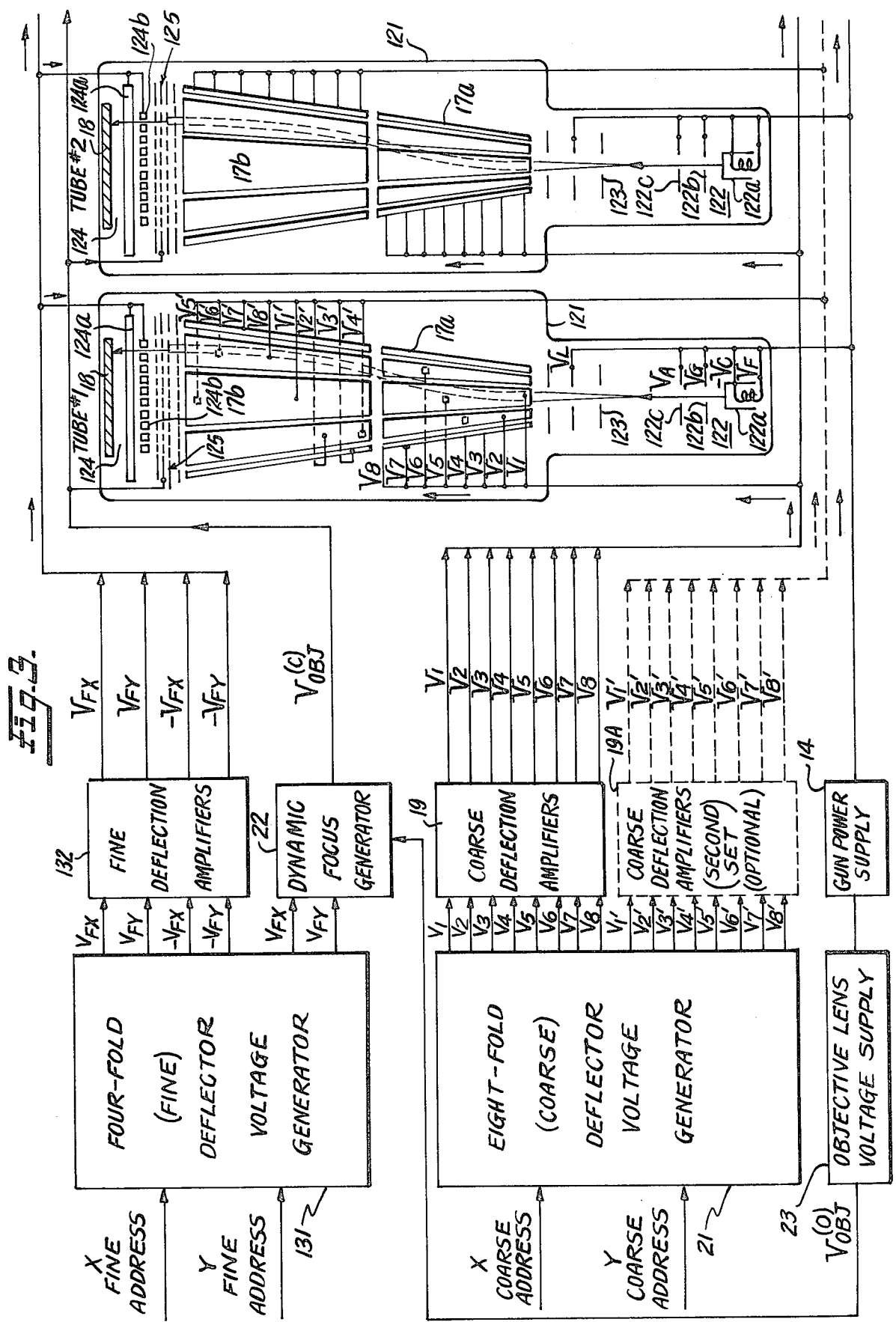

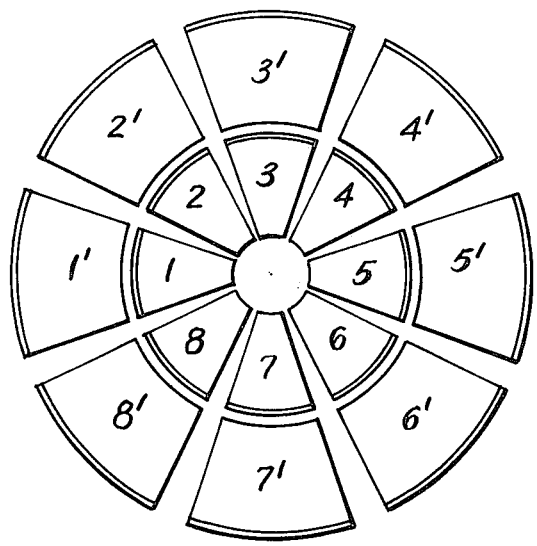
Fig.3A.
| PLATE NO. | VOLTAGE | |
|---|---|---|
| | MECH. BALANCE | ELEC. BALANCE |
| 1' | $V_5$ | $bV_5$ |
| 2' | $V_6$ | $bV_6$ |
| 3' | $V_7$ | $bV_7$ |
| 4' | $V_8$ | $bV_8$ |
| 5' | $V_1$ | $bV_1$ |
| 6' | $V_2$ | $bV_2$ |
| 7' | $V_3$ | $bV_3$ |
| 8' | $V_4$ | $bV_4$ |
TOP SECTION VOLTAGE RELATIVE TO BOTTOM SECTION VOLTAGE
Fig.3C.
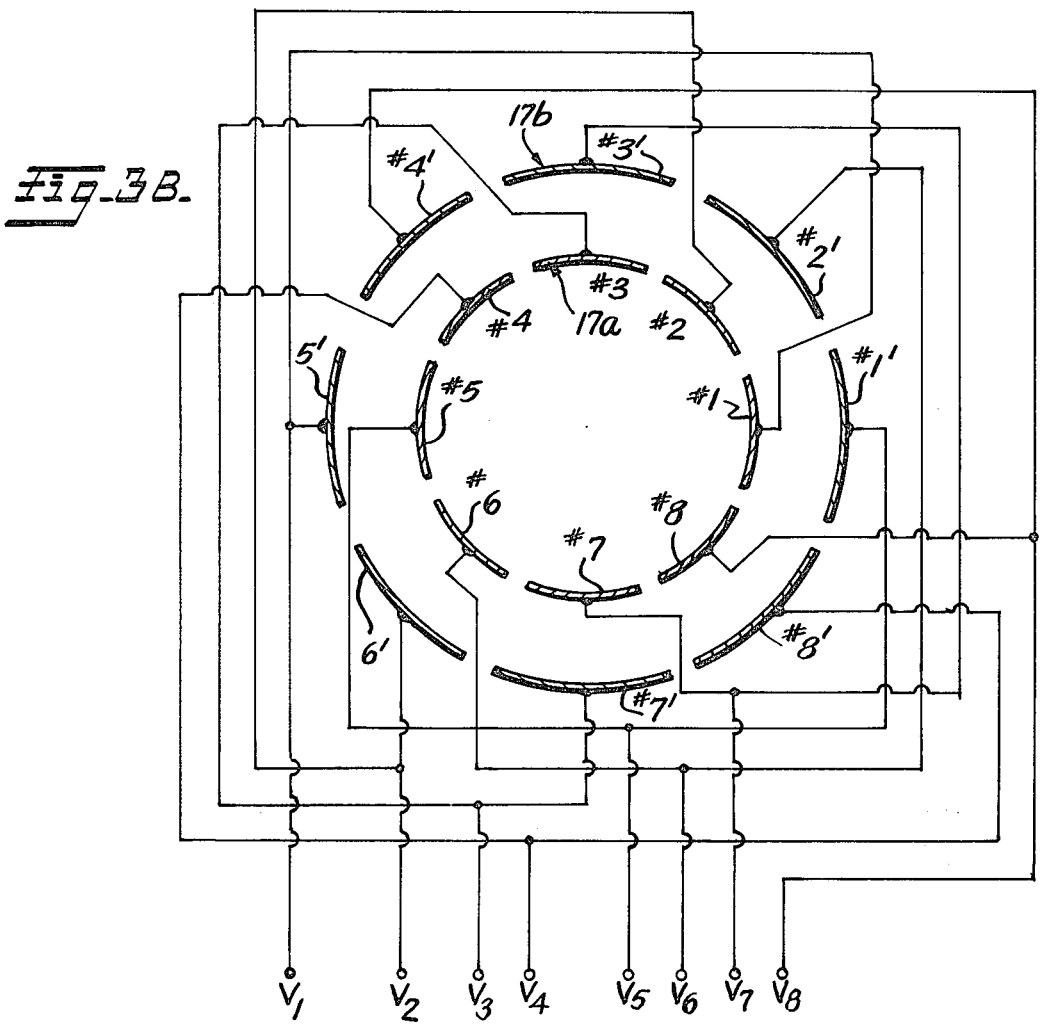
Fig.3B.

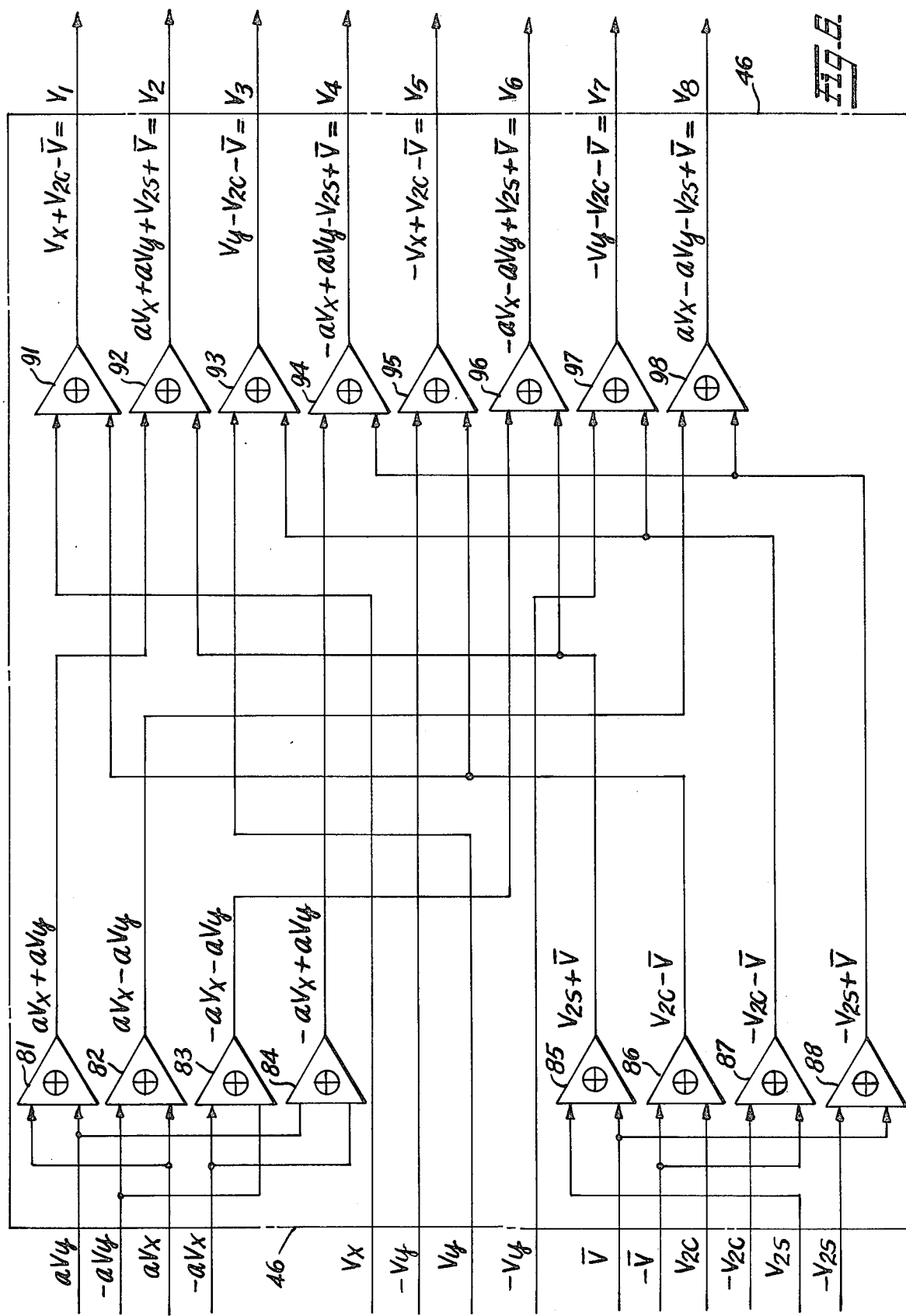

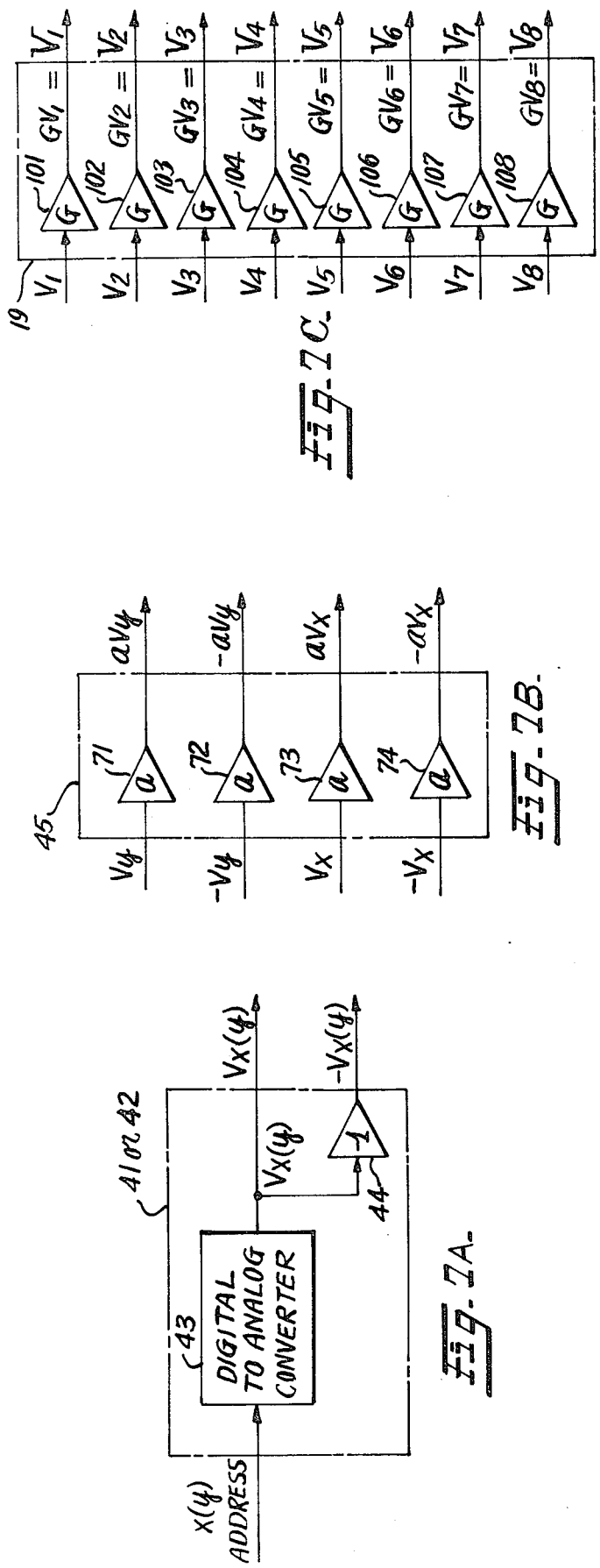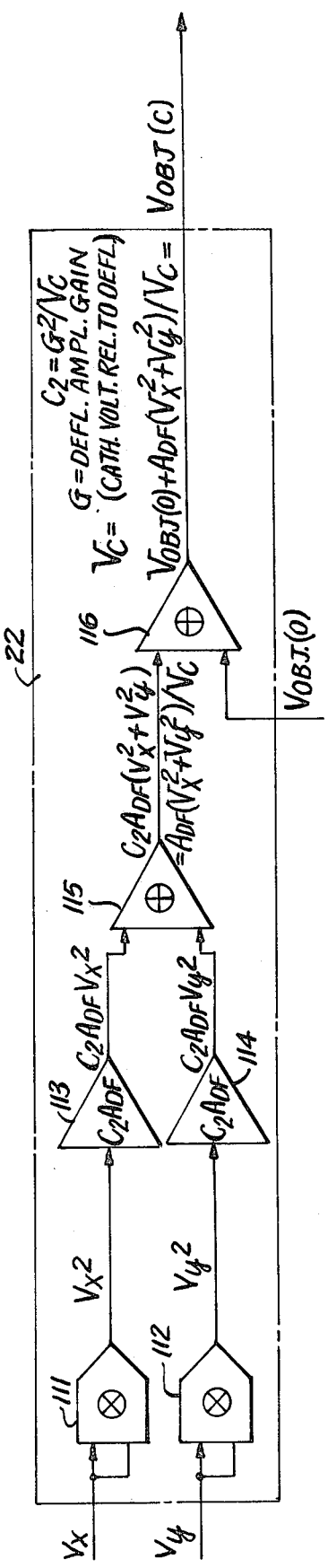

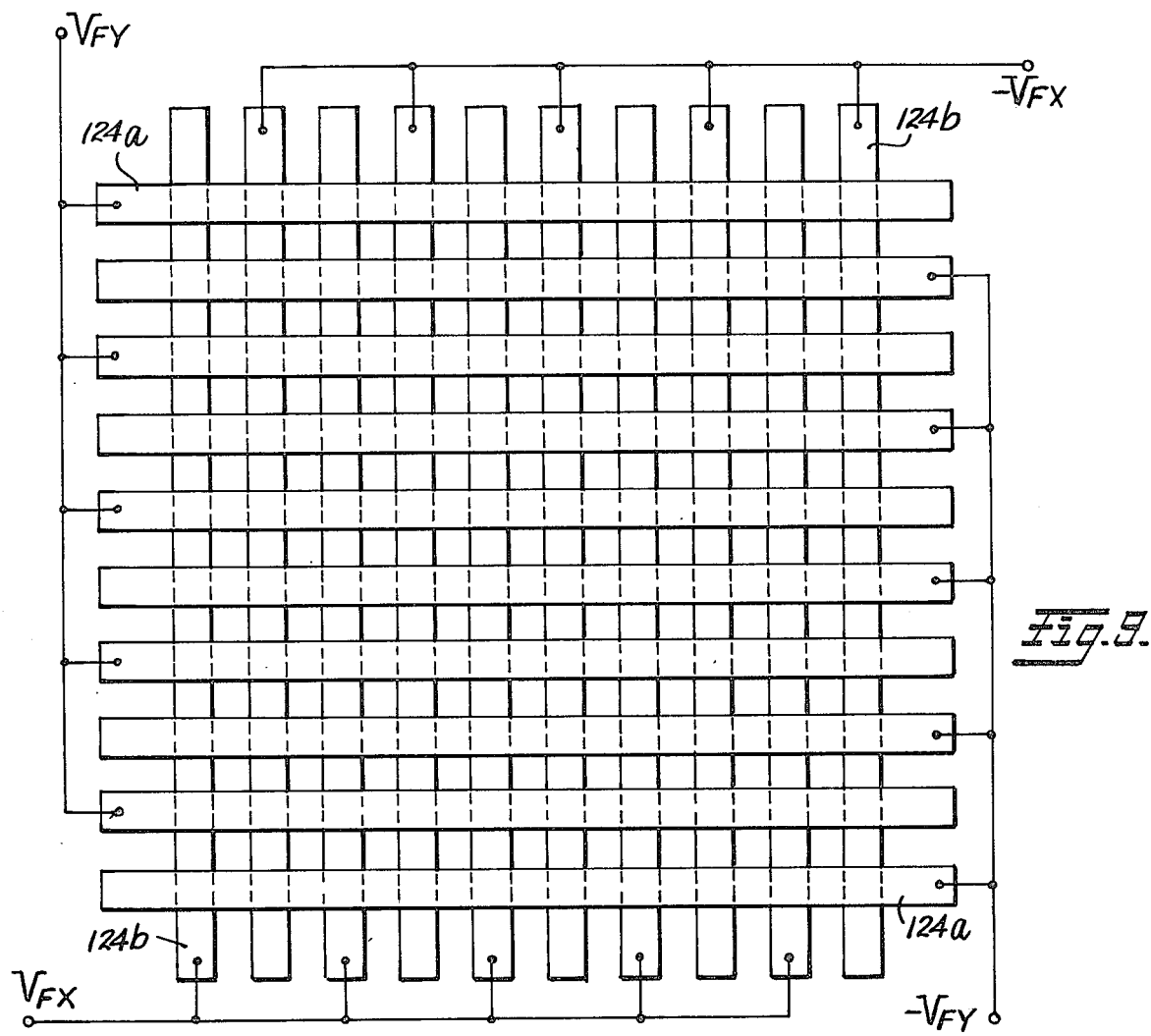
Fig. 9.
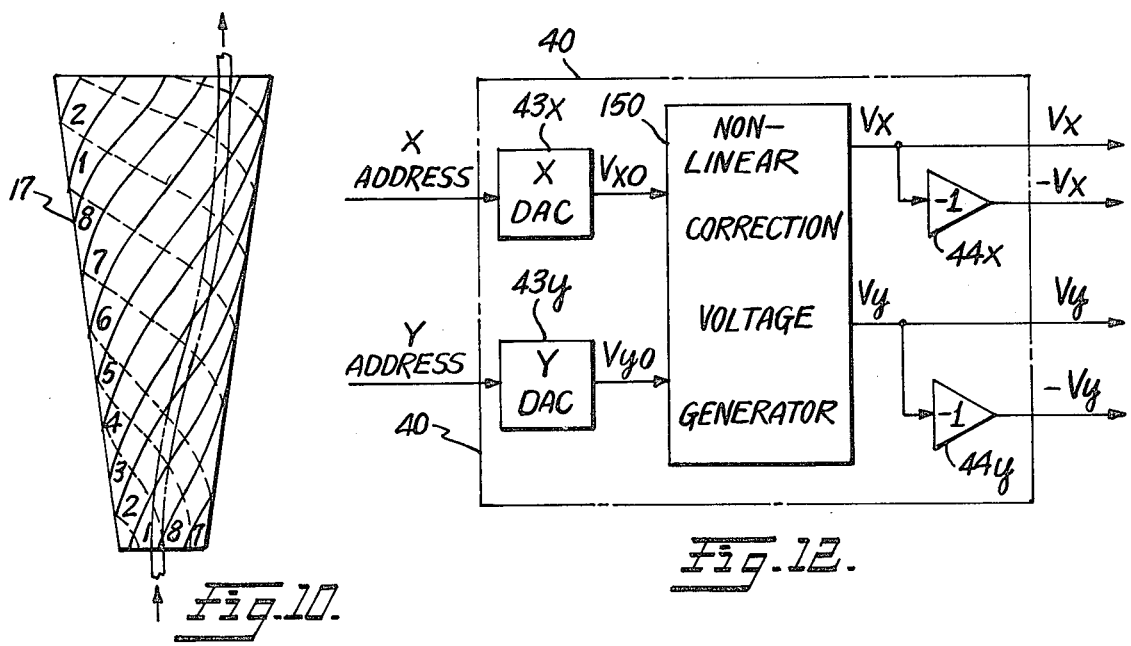
Fig. 10.
Fig. 12.

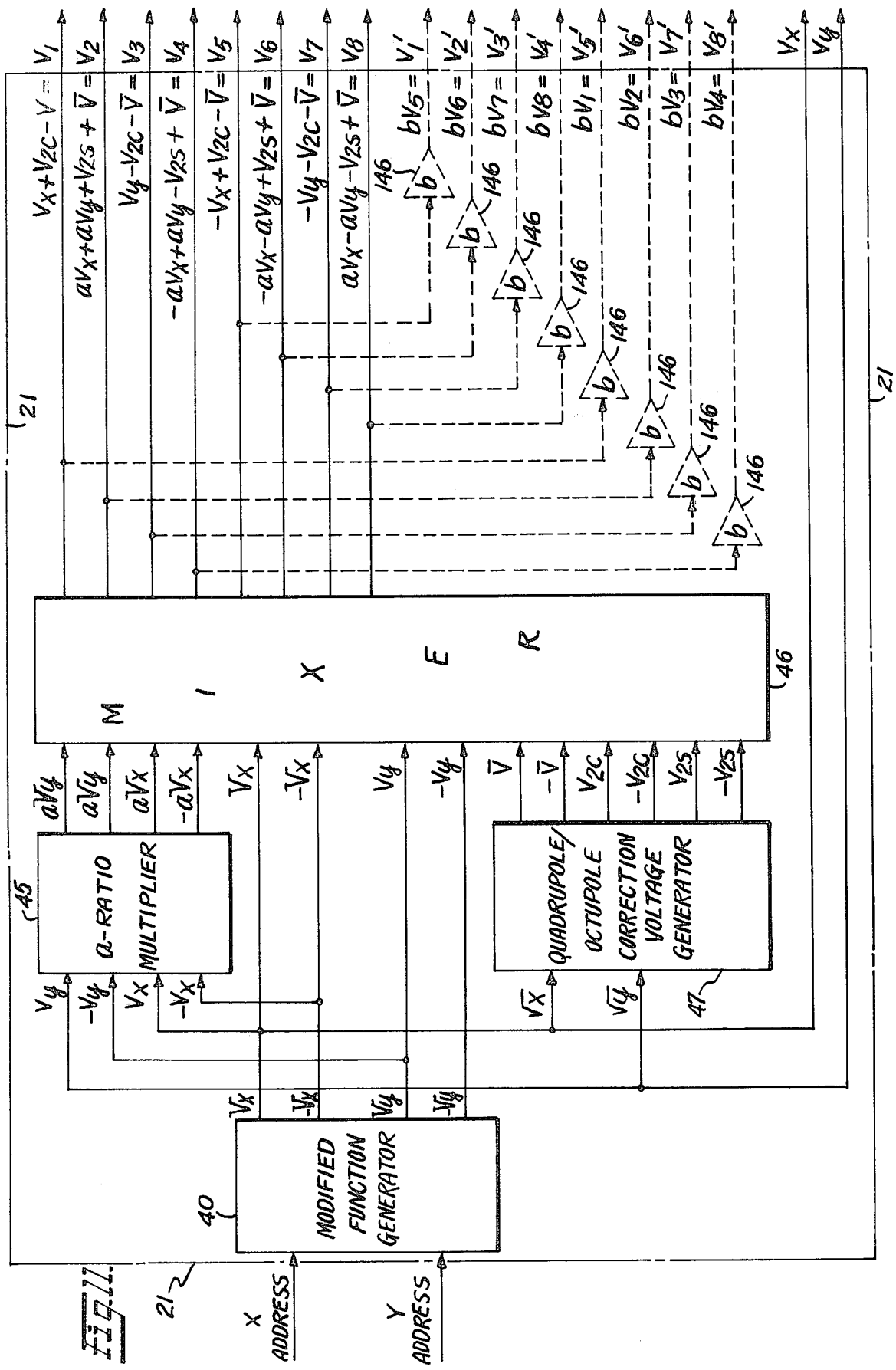

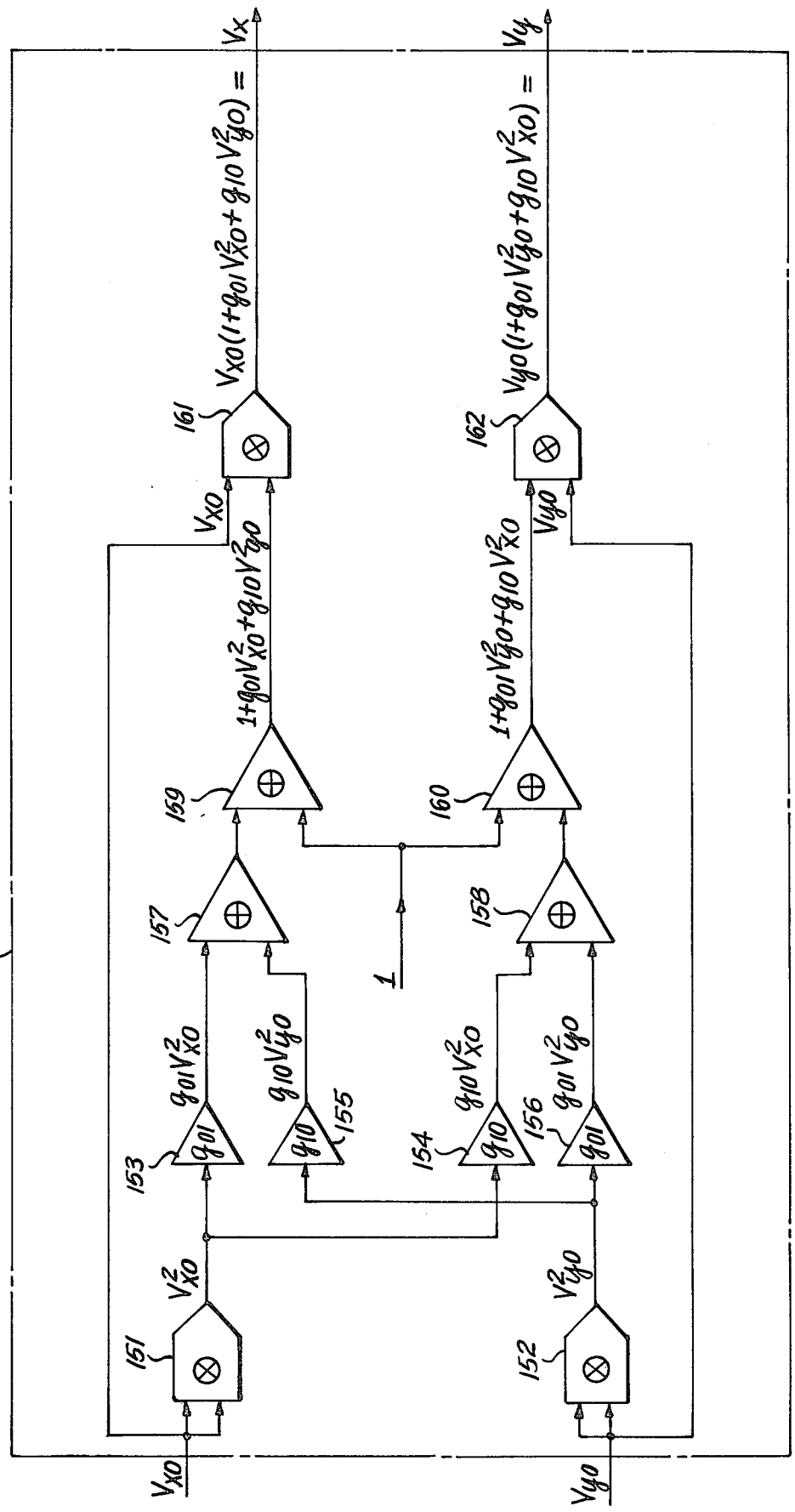

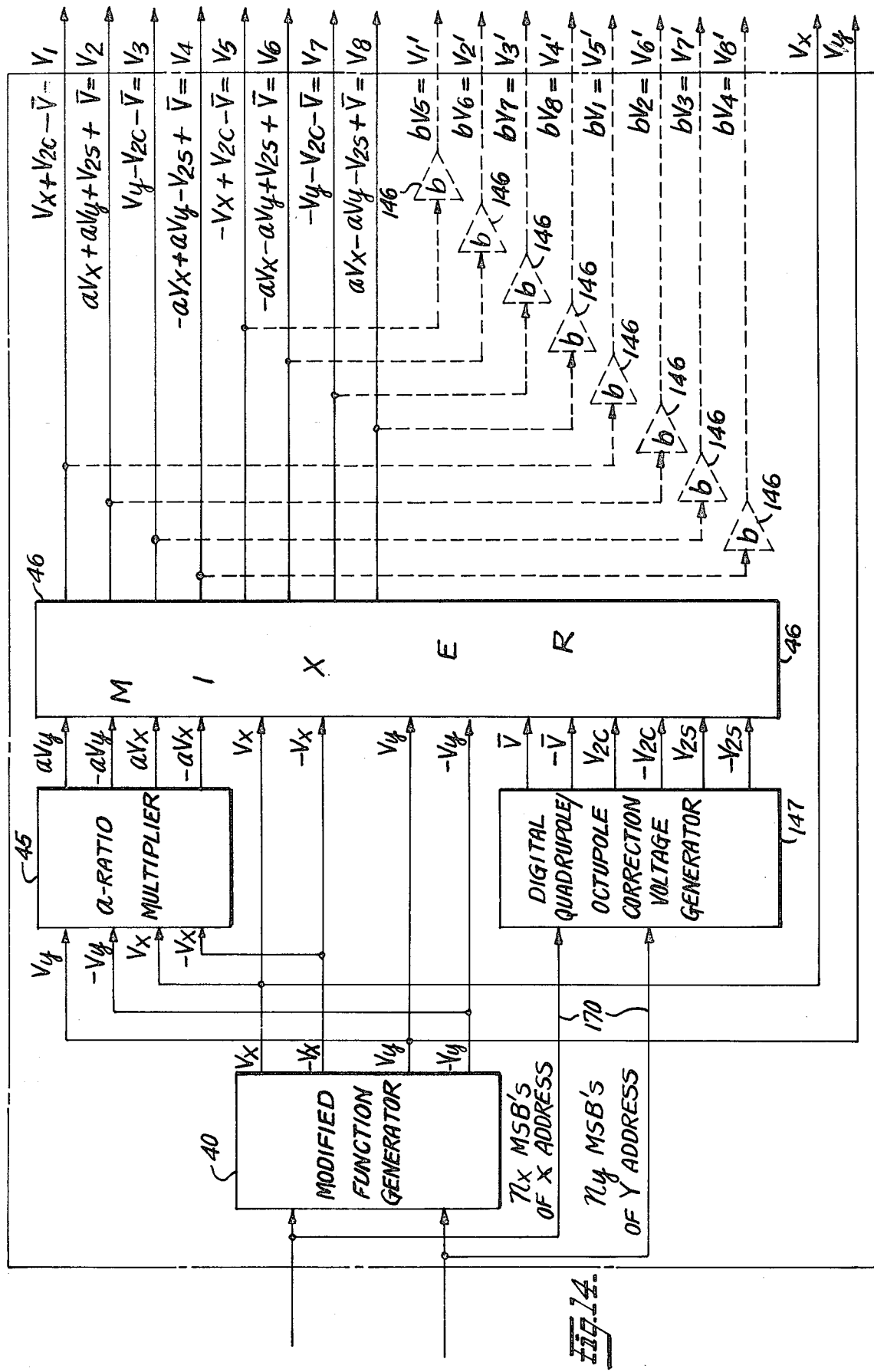

METHOD AND MEANS FOR DYNAMIC CORRECTION OF ELECTROSTATIC DEFLECTOR FOR ELECTRON BEAM TUBE

BACKGROUND OF INVENTION

1. Field of Invention

This invention relates to a new method and means for the dynamic correction and minimization of aberrations produced in the electron beam of electron beam tubes employing electrostatic deflection systems.

2. Prior Art Problems

In recent years considerable effort has been expended in the development of electron beam addressable memories for use as peripheral, add-on or main memories for computer systems. These memories, known as EBAM have been described in a number of publications and patents such as U.S. Pat. No. 3,886,530—issued May 27, 1975—Huber, et al., entitled "Signal Storage Device." In an electron beam addressable memory the number of data storage sites that the electron optical system can resolve at the target plane (at fixed current density), or the current density that can be achieved (with a fixed number of data bit sites), varies inversely with the electron beam spot aberration at the target plane. Electron beam spot aberration is introduced by the deflector system as it causes the electron beam to traverse from a center axis position across the x-y plane of a target surface to a particular address bit site location whose x-y coordinates identify the data to be stored and/or retrieved. For maximum data storage on a given target surface area, electron beam spot aberration must be kept to a minimum.

While the problem of spot aberration can be overcome through the use of magnetic deflection, which can be designed to have low aberration, magnetic deflection suffers from poor speed of response and lack of reproducibility (due to eddy current and hysteresis effects). To obtain high speed of response and good reproducibility, electrostatic deflection is preferred. However, known electrostatic deflection systems introduce significant beam spot aberration. Thus, a low-aberration electrostatic deflection system is needed for high speed, high resolution applications such as electron beam addressable memories and electron beam microfabrication systems.

SUMMARY OF INVENTION

It is therefore a primary object of the present invention to provide a new method and means for the dynamic correction and minimization of aberrations produced in the electron beam of electron beam tubes employing electrostatic deflection systems.

In practicing the invention an electron beam tube electrostatic deflection system is provided which comprises an evacuated housing and an electron gun disposed at one end of the evacuated housing for producing a beam of electrons. A lens structure is secured within the evacuated housing intermediate the electron gun means and the opposite end of the housing and is disposed along the path of the beam of electrons for focusing and centering the beam of electrons into a finely focused pencil-like beam of electrons. Eight-fold deflector means are secured within the housing and disposed about the path of the finely focused beam of electrons. The eight-fold deflector means comprises eight electrically conductive spaced-apart members which are electrically isolated one from the other and annularly arranged around the center electron beam path of the finely focused, pencil-like beam of electrons. Means are provided for applying deflection electric potentials to the respective members of the eight-fold deflector means for electrostatically deflecting the finely focused electron beam to a desired point on a target plane located at an opposite end of the evacuated housing from the electron gun means. Means are provided for applying correction electric potentials to the respective members of the eight-fold deflector means in conjunction with the deflection electric potentials to minimize electron beam spot aberration at the target plane. The means for applying correction electric potentials to the respective members of the eight-fold deflector means comprises means for applying two different quadrupole correction electric potentials to selected ones of the eight-fold deflector members and means for applying an octupole correction electric potential to all eight deflector members.

In a preferred embodiment of the invention, the eight-fold deflector members are plate centered with respect to the x and y axes of the projected target plane and the eight-fold deflector members are disposed such that a first deflector member is centered on the x axis and is identified as number 1 and the remaining seven eight-fold deflector members are evenly and annularly spaced about the center electron beam axis defined by the intersection of the x and y axes and are consecutively numbered 2-8 in a counter clockwise direction from the number 1 deflector as viewed in cross section looking towards the target plane from the electron gun. The deflection electric potentials applied to the respective eight-fold deflector members 1-8 starting from number 1 deflector member are respectively given by the values $V_x$, $a(V_x + V_y)$, $V_y$, $-a(V_x - V_y)$, $-V_x$, $-a(V_x + V_y)$, $-V_y$ and $a(V_x - V_y)$ where "a" equals substantially the value $\sqrt{2}/2$, $V_x$ is the analog deflection voltage value corresponding to a desired x axis address point on the target plane and $V_y$ is the analog deflection voltage value corresponding to a desired y axis address point on the target plane. The quadrupole and octupole correction electric potentials applied to one set of four eight-fold deflector members comprised by members 1, 3, 5 and 7 are given respectively by the values $(V_{2c} - \overline{V})$, $(-V_{2c} - \overline{V})$, $(V_{2c} - \overline{V})$ and $(-V_{2c} - \overline{V})$ and the quadrupole and octupole correction potentials applied to the remaining number 2, 4, 6 and 8 eight-fold deflector members are given respectively by the values $(V_{2s} + \overline{V})$, $(-V_{2s} + \overline{V})$, $(V_{2s} + \overline{V})$ and $(-V_{2s} + \overline{V})$ where the quadrupole correction electric potentials $V_{2c}$ and $V_{2s}$ applied to the said respective sets of four eight-fold deflector members are given by the expression $$V_{2c} = [A_{2c}(V_x^2 - V_y^2)]/V_c \qquad (1)$$

and $$V_{2s} = (2A_{2s} V_x V_y)/V_c \qquad (2)$$

and the octupole correction voltage $\overline{V}$ applied to all eight-fold deflector members is given by the expression $$\overline{V} = [A_4(V_x^4 - 6V_x^2 V_y^2 + V_y^4)]/4V_c^3 \qquad (3)$$

where $A_{2c}$, $A_{2s}$ and $A_4$ are constants and $-V_c$ is the cathode voltage of the electron gun means, measured with respect to the voltage at the deflector means when $V_x = V_y = 0$.

In preferred embodiments of the invention a dynamic focusing electric potential is applied to the lens structure in conjunction with the deflection and correction electric potentials applied to the eight-fold deflector means and the dynamic focusing electric potential is given by the value $$V_{OBJ(DF)} = V_{OBJ(0)} + [A_{DF}(V_x^2 + V_y^2)]/V_c \quad (4)$$

where $A_{DF}$ is a constant and $V_{OBJ(0)}$ is the uncorrected value of the direct current objective lens supply voltage.

The means for applying deflection electric potentials and means for applying correction electric potentials to the respective eight-fold deflector members preferably are comprised by an eight-fold deflector voltage generator means for generating both the deflection and the correction potentials simultaneously and applying the combined deflection and correction potentials to the respective eight-fold deflector members after amplification by a set of deflection amplifiers. The eight-fold deflector generator means is comprised by respective x and y function generator means for converting the respective x axis and y axis electric address signals to corresponding analog voltages having the values $v_x$, $-v_x$ and $v_y$, $-v_y$. The eight-fold deflector generator means further comprises quadrupole-octupole generator means which is the heart of the system and is responsive to the output from the respective x and y function generator means and derives the output potentials $\bar{v}$, $-\bar{v}$, $v_{2c}$, $-v_{2c}$ and $v_{2s}$, $-v_{2s}$. Ratio multiplier means for multiplying a ratio "a" times the outputs from the x and y function generator means is provided for deriving the potentials $(av_x + av_y)$, $(-av_x + av_y)$, $(-av_x - av_y)$ and $(av_x - av_y)$. The eight-fold deflector voltage generator finally includes mixer means comprising a plurality of interconnected summing amplifiers responsive to the outputs from the x and y function generator means, the quadrupole-octupole generator means and the "a" ratio multiplier means for combining and deriving eight different combined deflection and correction electric potentials $v_1$ to $v_8$ for application to the respective eight-fold deflector members 1 to 8 wherein $$v_1 = v_x + v_{2c} - \bar{v},$$
$$v_2 = av_x + av_y + v_{2s} + \bar{v},$$
$$v_3 = v_y - v_{2c} - \bar{v},$$
$$v_4 = -av_x + av_y - v_{2s} + \bar{v},$$
$$v_5 = -v_x + v_{2c} - \bar{v},$$
$$v_6 = -av_x - av_y + v_{2s} + \bar{v},$$
$$v_7 = -v_y - v_{2c} - \bar{v} \text{ and}$$
$$v_8 = av_x - av_y - v_{2s} + \bar{v}.$$

In most applications, these combined deflection and correction potentials are first amplified in deflection amplifiers providing a gain G before being supplied to the deflector members.

In a simple form of the invention employing only a single eight-fold deflector to direct the finely focused electron beam onto the target plane, the lens assembly of the electron beam tube structure is comprised by a condenser lens and an objective lens with the condenser lens maintained at the same potential as the cathode of the electron gun of the tube and disposed intermediate the electron gun and the objective lens. The objective lens is supplied with the dynamic focusing potential $V_{OBJ(c)}$ supplied from the dynamic focus generator. Other versions of this simple form are possible, such as the condenser lens at a separate potential from cathode or else absent, or the single eight-fold deflector proceding or imbedded within the objective lens.

In a compound flys-eye type of electron beam tube version of the invention, the eight-fold deflector means comprises a coarse deflector means and the tube further includes a fine deflector system disposed between the target plane and the eight-fold coarse deflector system within the evacuated housing. In this structure the lens means comprises the collimating lens assembly (which may be preceded by a condenser lens assembly) disposed intermediate to the electron gun and the eight-fold coarse deflector system. The lens means further includes an objective lens assembly interposed between the eight-fold coarse deflector system and the fine deflector system and the dynamic focusing electric potential is supplied to the objective lens assembly. The eight-fold coarse deflector system preferably is comprised of two separate eight-fold deflector sections with each eight-fold deflector section comprised of eight elemental deflector members annularly arrayed around the center electron beam path and with the corresponding elemental eight-fold deflector members of each section interconnected electrically whereby the $v_1$ combined deflection and correction potential is applied to the number 1 eight-fold deflector member of the first section and the number 5 deflector member of the second section and the $v_2$, $v_3$, $v_4$, $v_5$, $v_6$, $v_7$, $v_8$ potentials are applied to corresponding respective numbers 2, 3, 4, 5, 6, 7 and 8 eight-fold deflector members of the first eight-fold deflector section and to the number 6, 7, 8, 1, 2, 3 and 4 deflector members of the second section, respectively.

The heart of the new deflection system is a quadrupole-octupole generator which is comprised by a correction potential signal generator for an electron beam tube of the electrostatic deflection type and which preferably comprises first multiplier circuit means responsive to a deflection voltage signal $v_x$ for multiplying the $v_x$ signal by itself to derive a signal $v_x^2$ and second multiplier circuit means responsive to a deflection voltage signal $v_y$ for multiplying the $v_y$ signal by itself to derive a signal $v_y^2$. The quadrupole-octupole generator is further comprised by a first and second summing amplifier means both responsive to the $v_x^2$ signal and first and second operational amplifier means having the transfer functions $-(3 + 2\sqrt{2})$ and $-(3 - 2\sqrt{2})$, respectively, connected intermediate the output of the second multiplier means and the second summing input terminal of the first and second summing circuit means respectively for deriving two separate signals having the values $-(3 + 2\sqrt{2})v_y^2$ and $-(3 - 2\sqrt{2})v_y^2$, respectively, and supplying the two signals to the respective first and second summing circuit means. The first and second summing circuit means serve to sum together the $v_x^2$ signal with the signals from the respective first and second operational amplifier means to derive two separate signals having the values $v_x^2 - (3 + 2\sqrt{2})v_y^2$ and $v_x^2 - (3 - 2\sqrt{2})v_y^2$, respectively. Third multiplier circuit means are provided which are responsive to the outputs from the first and second summing circuit means for multiplying together the two outputs thereof and third operational amplifier means are included which are responsive to the product from the third multiplier circuit means and has the transfer function $\frac{1}{4} C_1^3 A_4$ for deriving the octupole correction potential $\bar{v} = \frac{1}{4} C_1^3 A_4 (v_x^4 - 6v_x^2 v_y^2 + v_y^4)$ where $C_1$ = $G/V_c$ and G is the gain of the deflection amplifier, $-V_c$ is the cathode voltage of the electron gun of the electron beam tube, and $A_4$ is a constant.

The quadrupole-octupole correction potential signal generator preferably further includes fourth multiplier circuit means responsive to the $v_x$ and $v_y$ deflection signal potentials for deriving a signal $v_x v_y$. In addition the quadrupole-octupole generator further includes third summing amplifier means having a first summing input terminal connected to the $v_x^2$ output of the first multiplier circuit means and inverter amplifier means connected between the $v_y^2$ output of the second multiplier circuit means and the second summing input terminal of the third summing circuit means for supplying a signal $-v_y^2$ thereto. The third summing amplifier means serves to derive a signal $v_x^2 - v_y^2$ and supplies that signal to a fourth operational amplifier having a transfer function $C_1 A_{2c}$ which is responsive to the $v_x^2 - v_y^2$ signal for deriving the quadrupole correction potential $v_{2c} = C_1 A_{2c} (v_x^2 - v_y^2)$. The quadrupole-octupole generator means further comprises fifth operational amplifier means having the transfer function $2 C_1 A_{2s}$ and responsive to the $v_x v_y$ signal from the fourth multiplier circuit means for deriving the quadrupole correction potential $v_{2s} = 2 C_1 A_{2s} v_x v_y$. The quadrupole-octupole generator means also preferably includes second, third and fourth inverter amplifier means connected respectively to the outputs from the third, fourth and fifth operational amplifier means for deriving the $-\bar{v}$ octupole correction potential, the $-v_{2c}$ quadrupole correction potential and the $-v_{2s}$ quadrupole correction potential, respectively.

BRIEF DESCRIPTION OF DRAWINGS

The above and other objects, features and many of the attendant advantages of this invention will be appreciated more readily as the same becomes better understood from a reading of the following detailed description, when considered in connection with the accompanying drawings, wherein like parts in each of the several figures are identified by the same reference character, and wherein:

FIG. 3 is a functional block diagram of a compound fly's eye type EBAM;

FIGS. 3A and 3B are schematic cross sectional illustrations of a suitable electron beam tube apparatus for use with the EBAM of FIG. 3 wherein FIG. 3A is looking from the target toward the electron gun and FIG. 3B is looking from the gun toward the target;

FIG. 3C is a chart showing the relationship of the combined deflection and correction potentials applied to the deflector members of a two-stage, coarse electrostatic deflector.

FIG. 6 is a functional block diagram of a mixer included in the eight-fold deflection-correction voltage generator shown in FIG. 4;

FIG. 7A is a functional block diagram showing the construction of a function generator included in the eight-fold deflection-correction voltage generator of FIG. 4, FIG. 7B is a functional block diagram of an "a" ratio multiplier included in the eight-fold deflection-correction voltage generator shown in FIG. 4, FIG. 7C is a functional block diagram of a deflection amplifier employed in the systems of both FIG. 1 and FIG. 3, and FIG. 7D is a functional block diagram of a dynamic focus generator employed with both the systems of FIG. 1 and FIG. 3;

FIG. 9 is a rear end view of the fine deflector grid system of an EBAM tube as seen looking from the electron gun toward the target;

FIG. 10 shows an alternative construction for the coarse deflector wherein a 8-plate twisted deflector is employed;

FIG. 11 is a functional block diagram of an alternative form of eight-fold deflector voltage generator for use with the EBAM system of FIG. 3;

FIG. 12 is a functional block diagram of a modified function generator for use with the eight-fold deflector voltage generator of FIG. 11;

FIG. 13 is a schematic circuit diagram of a non-linear correction generator used in the function generator of FIG. 12;

FIG. 14 is a functional block diagram of a preferred digital eight-fold deflector voltage generator suitable for use in practicing the invention;

DETAILED DESCRIPTION OF PREFERRED EMBODIMENTS

Figure 1:
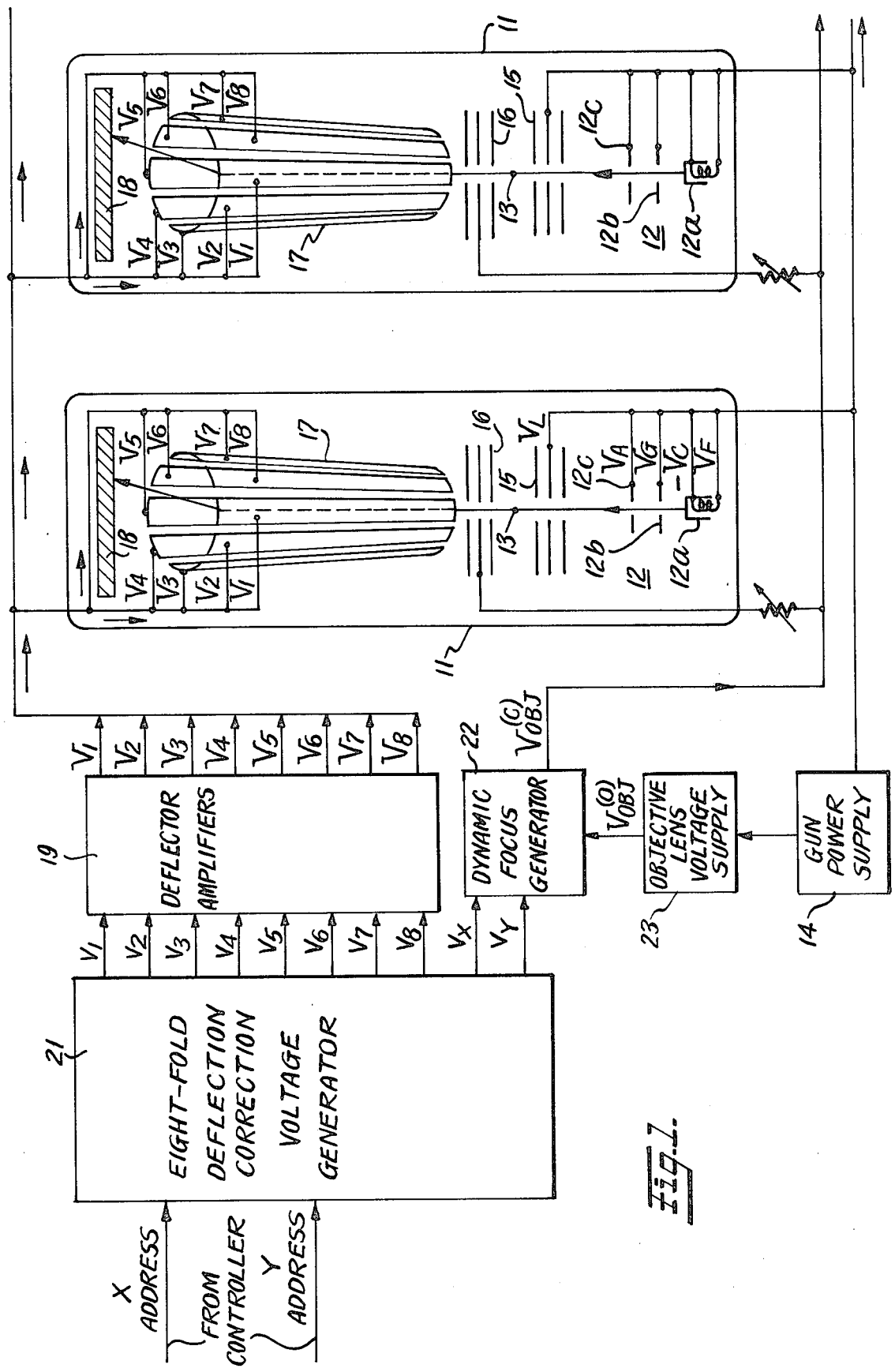
FIG. 1 is a combined functional block diagram and schematic illustration of an electrostatic deflection type electron beam tube apparatus employing the new method and means for dynamic correction and minimization of electron beam spot aberration in accordance with the invention.

FIG. 1 is a schematic functional block diagram of a set of electron beam tubes, identified as tube no. 1 and tube no. 2, etc., which employ electrostatic deflection systems constructed according to the invention and which are suitable for use as electron beam addressable memories (EBAMS). While only two electron beam tubes have been shown in FIG. 1 for use as electron beam addressable memories, it should be understood that any number of such tubes could be connected in parallel and selectively operated in accordance with the present invention in order to provide an EBAM of desired capacity. The electron beam tubes no. 1, no. 2, etc. are identical in construction; hence, only one of the tubes will be discussed in detail in the following description. The electron beam tube no. 2, for example, is comprised of an evacuated housing 11 of glass, metal, or other suitable impervious material which readily can be molded into an elongated cylindrical or other similar configuration and evacuated. Disposed within the housing 11 is an electron gun 12. The electron gun 12 may be comprised of a thermal dispenser type cathode 12a, a grid 12b and an anode 12c for producing a beam of electrons and projecting the beam of electrons along a central pathway indicated at 13. The cathode 12a comprises a thermal dispenser type, barium impregnated tungsten thermal emitter which is relatively inexpensive, and has a long life (5 years) at loadings of the order of 1 amp per centimeter$^2$ and in a vacuum of the order of $3 \times 10^{-8}$ Torrs. Operating potentials for the thermal emitter cathode 12a are selectively supplied from a gun power supply shown at 14 of conventional construction. Upon being selectively energized, a beam of electrons produced by electron gun 12 is projected through first a condenser lens assembly 15 and then through an objective lens assembly 16. Both lens assemblies are positioned along the electron beam path 13 and are disposed so that the electron beam passes through their center. The lens assemblies 15 and 16 comprise essentially stacked arrays of conductive plates having a central opening therein and suitable potentials are supplied to the plates. The condenser lens assembly is supplied with the same potential as that applied to the cathode 12a of the electron gun from the gun power supply 14. The objective lens assembly 16 is supplied separately from an objective lens voltage supply corrected with a dynamic focusing potential as will be described more fully hereinafter. Thus the lens means comprised by the serially arranged condenser lens assembly 15 and objective lens assembly 16 serve to demagnify and focus the beam of electrons produced by electron gun 12 into a finely focused, pencil-like beam of electrons.

The finely focused beam of electrons passes through an eight-fold deflector structure 17 which is constructed and operated according to the present invention so as to cause the electron beam to be moved to any desired address point on the x-y planar target surface of a target element shown at 18. For a more detailed description of the construction and manner of operation of the target element 18 whereby data is stored by electric charges on the target element 18 and thereafter retrieved by means of the electron beam accessing, reference is made to the above-identified U.S. Pat. No. 3,886,530 and to a further publication in a paper presented at the ELECTRO/76 conference held in Boston, Mass. on 11-14 May, 1976 entitled "Electron Beam Memories" by D. E. Speliotis, Donald O. Smith, Kenneth J. Harte, and Floyd O. Arntz. Briefly, however, it should be noted that the EBAM stores data at a particular x-y address location on the planar surface of the target element 18 by either the presence or absence of an electric charge at the particular x-y location in question. In this regard is should be noted that as viewed by the reader the x axis of the planar surface of target element 18 extends out of the plane of the drawing, and the y axis will be considered to extend left along the plane of the drawing as viewed by the reader. During readout of information previously stored on the target element, the presence or absence of an electric charge at a particular x-y address location on the planar surface of target element 18 will result in the production of either a greater or smaller electric output signal upon interrogation of the location by the electron beam as explained more fully in the above-identified literature.

Figure 2:
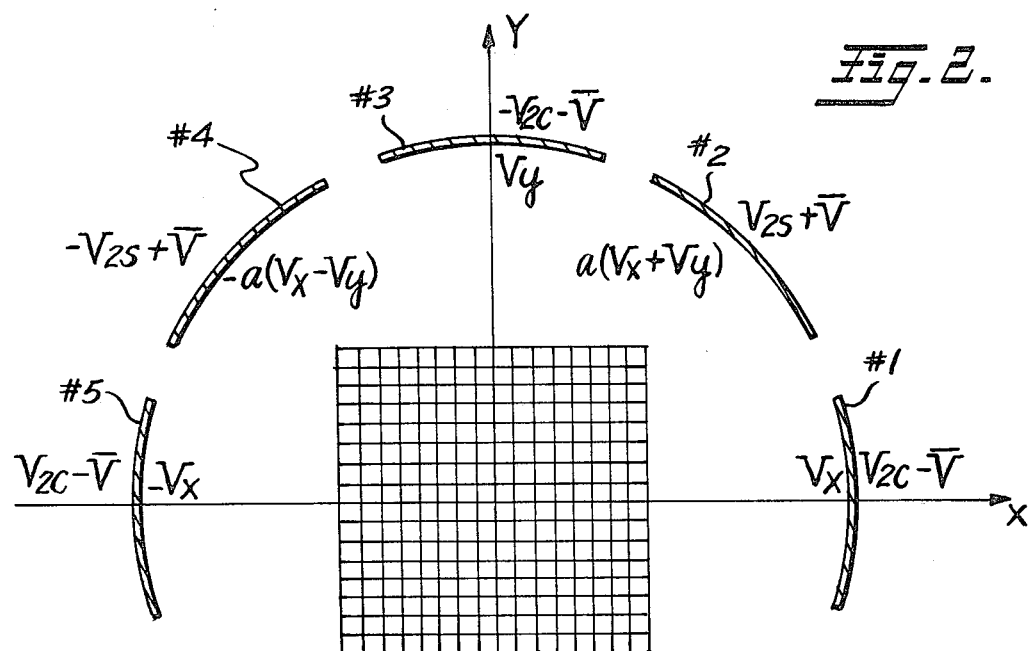
FIGS. 2 and 2A are respective cross sectional and sectional views of an electron beam tube apparatus constructed in accordance with the invention taken through a plane across the deflector members (looking from the electron gun toward the target) and axially along the center axis, respectively, of one of the EBAM tubes, such as tube member 2 shown in FIG. 1 of the drawings.
Figure 2A:
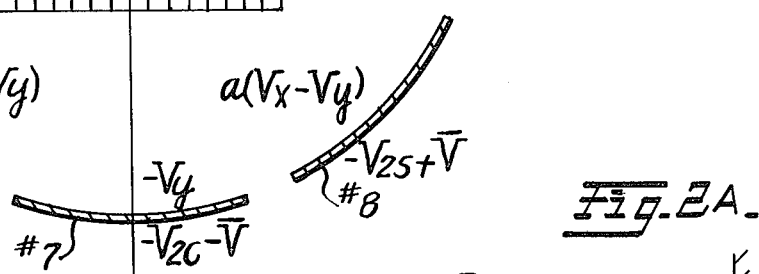

The eight-fold deflector assembly 17 is comprised of eight electrically conductive members numbered no. 1 through no. 8, which are electrically isolated one from the other and annularly arrayed around the center, finely focused electron beam path in a regular manner as best seen in FIG. 2 of the drawings. From FIGS. 1 and 2 it will be seen that each of the deflector members in cross section approximates a partial section of a circular curve and each has a substantially elongated trapezoidal configuration extending in the direction along the electron beam path. The elongated trapezoidal configuration of each of the eight-fold deflector members is required due to the frusto-conical shape of the completed eight-fold deflector assembly, a longitudinal sectional view of which is illustrated in FIG. 2A of the drawings. As shown in FIG. 2A, the smaller diameter end $D_1$ of the eight-fold deflector assembly is positioned adjacent the objective lens assembly within evacuated housing 11, and the larger diameter end $D_2$ of the assembly constitutes the outlet end and is located adjacent to the target element 18. The cross sectional dimensions of the deflector members no. 1 through no. 8 is proportioned along the axial length thereof in a manner such that each elemental section of the member occupies a fixed proportional part of the arc of a circle extending from the smaller diameter $D_1$ end to the larger diameter $D_2$ end of the assembly. The cylindrical limit, in which $D_1$ becomes equal to $D_2$, may also be used.

The application of appropriate deflection potentials to the respective deflector members of the eight-fold deflector assembly 17 will cause the electron beam to access to a desired x-y address location on the planar surface of the target element 18. These deflection potentials are supplied from deflection amplifiers shown generally at 19 in FIG. 1 and in turn are supplied from an eight-fold deflection-correction voltage generator 21. The eight-fold deflection-correction voltage generator 21 will be described more fully hereinafter with respect to FIG. 4 of the drawings and serves to derive eight separate potentials $v_1$-$v_8$ for supply through the deflection amplifiers 19 to the respective deflector members 1-8 of the eight-fold deflector assembly 17. In addition, the eight-fold deflection-correction voltage generator 21 derives two output voltages $v_x$ and $v_y$ for application to a dynamic focus generator 22 to be described more fully hereinafter with respect to FIG. 7D of the drawings. The eight-fold deflection-correction voltage generator 21 has supplied to it two input address signals representative of the x address and the y address storage location of data to be either stored or read out. The x and y addresses are supplied from a central controller with which the EBAM is used and generally are in some binary coded digital form.

In FIG. 2A, the electron beam is depicted at 13 and is shown deflected from its center axis position. From FIG. 2A it will be seen that when the electron beam 13 is deflected in this manner it of necessity passes closer to and hence becomes more influenced by certain of the deflector elements than is true of the others. Because of this fact, the cross sectional area of the electron beam 13, which determines the diameter of the electron beam spot at the target plane 18, may be adversely influenced so that the spot becomes elliptical rather than circular, for example. This distortion of the electron beam diameter is referred to as an aberration. As stated earlier, the number of data bits that any given electron optical system can resolve at a fixed current density, or the current density achievable with a given electron optical system at a fixed number of resolution elements (data sites) varies inversely with the electron beam spot aberration introduced by the deflector elements. This problem has been encountered in the past with respect to electron beam tubes employing electrostatic deflection systems. For example, U.S. Pat. No. 2,472,727 issued June 7, 1949 and U.S. Pat. No. 2,489,328 issued Nov. 29, 1949 to H. W. G. Salinger, et al. for electron beam controlling systems, both are concerned with the correction of aberrations in electrostatic deflection type electron beam tubes. These prior art devices, however, were intended for a different application than the present invention and employ quite dissimilar apparatus and techniques.

In order to provide a low aberration, electrostatic deflector assembly, the present invention generates dynamic correction potentials which are applied to the respective eight-fold deflector members simultaneously with the deflection potentials to reduce electron beam spot aberration to a minimum. In FIG. 2 of the drawings, the deflection potentials applied to each of the deflector members 1-8 are listed on the insides of the deflector members, and the dynamic correction potentials are listed on the outside of the members. Thus, in the case of the deflector member 1 the deflection potential corresponds to a voltage $V_x$ and the dynamic correction potential is represented by an octupole correction potential $-\overline{V}$ and a quadrupole correction potential $V_{2C}$. In the case of deflector element 2 the deflection potential is equal to a $(V_x + V_y)$ where "a" is a ratio multiplier representative of the fraction of the x-axis and the y-axis deflection voltage proportionally applied to the no. 2 plate element. Since the deflector plate elements are evenly annularly spaced about the finely-focused electron beam center axis, represented in FIG. 2 by the intersection of the x and y axis and extending into and out of the plane of the drawings, the "a" ratio multiplier is the same for all of the no. 2, 4, 6 and 8 deflector members. The dynamic correction potential applied to the no. 2 deflector member is given by the value $(V_{2S} + \overline{V})$ where again $\overline{V}$ is an octupole correction potential and $V_{2S}$ is a different quadrupole correction potential from that applied to the no. 1 deflector member. From FIG. 2 it will be seen that every other one of the deflector members no. 1, 3, 5 and 7 have the quadrupole correction potential $V_{2C}$ applied thereto and the alternate deflector members 2, 4, 6 and 8 have the quadrupole correction potential $V_{2S}$ applied thereto. The polarity of both the octupole correction potentials and the quadrupole correction potentials alternates from deflector member to deflector member as shown in FIG. 2 of the drawings. Thus, it will be appreciated that in the present invention the most general correction for an eight-plate deflector assembly is comprised of two quadrupole correction potentials and an octupole correction potential.

The terms of the two quadrupole and the octupole correction potentials take on slightly different forms, depending upon whether an addressing scheme is used in which the axes of the coordinate system of the target plane are gap-centered (GC) or plate-centered (PC) with respect to the deflector assembly. In addition, the allowed form of the correction terms depends upon the shape of the field over which the electron beam spot is to be corrected. FIG. 2 of the drawings illustrates a PC deflector assembly wherein the axes of the x-y coordinate system pass through the centers of the no. 1, 3, 5 and 7 deflector plates, respectively. The plate-centered configuration of the deflector assembly is preferred to a gap-centered configuration (as shown in FIG. 9 of the drawings) due to the fact that when accessing square or rectangular shape fields on the target plane, the largest aberrations are expected near the corners of the square or rectangle. In the PC configuration, the corners of the square or rectangular field are formed opposite the deflector member centers where the electrostatic field produced by the member is relatively smooth and well behaved. In the GC deflector configuration, on the other hand, the corners of the square or rectangular field would be opposite gaps, near which discontinuities in the electrostatic fields occur. In addition, discontinuities near gaps are amplified by mechanical imperfections in the deflector members, so that the PC configuration for a square or rectangular target field is expected to be less sensitive to mechanical defects.

Figure 4:
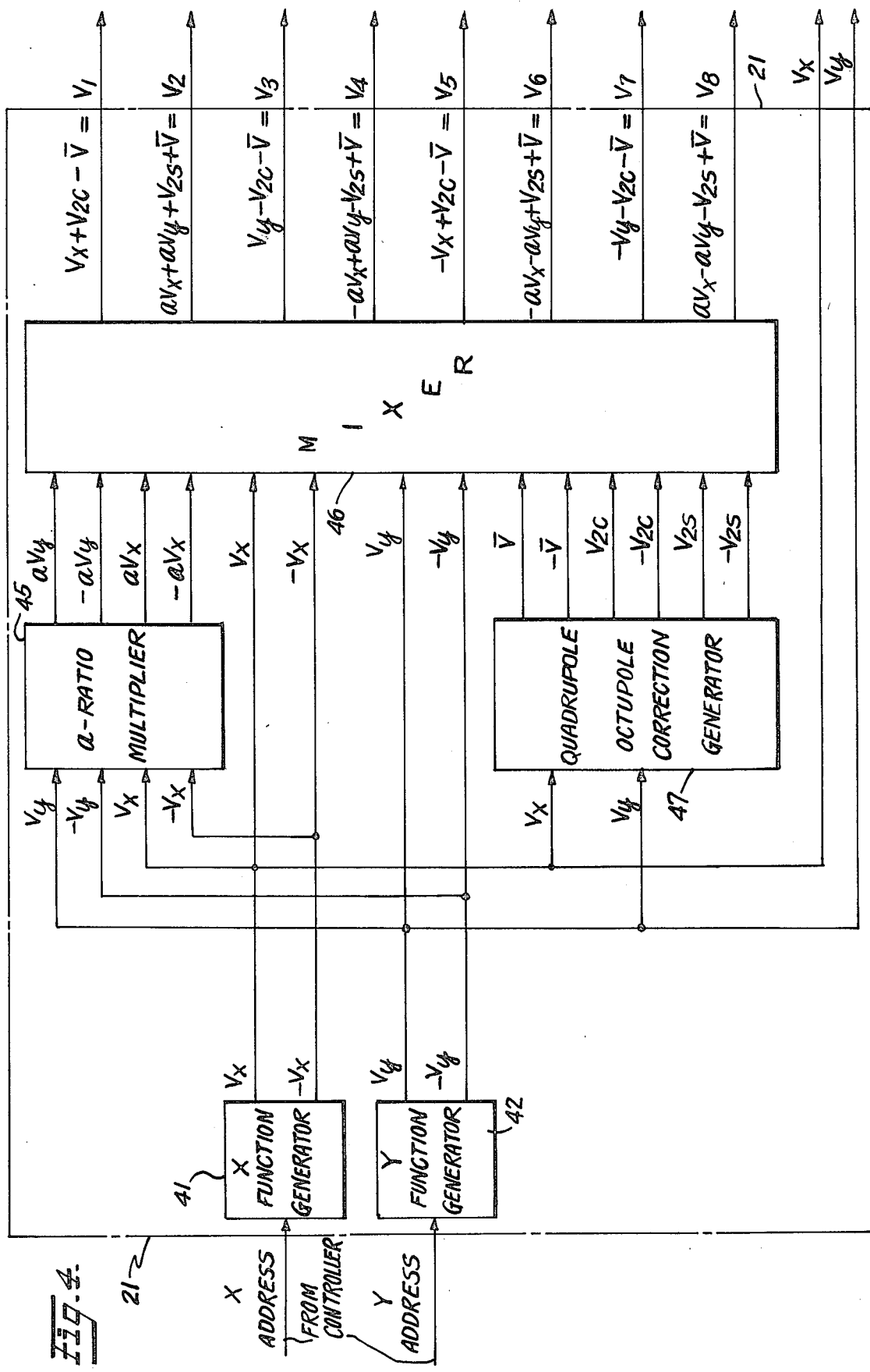
FIG. 4 is a functional block diagram illustrating the construction of the eight-fold deflection-correction voltage generator comprising a part of the systems in both FIGS. 1 and 3 of the drawings.

The construction of the eight-fold deflection-correction voltage generator 21 is shown in FIG. 4 of the drawings. In FIG. 4, the x and y addresses in some binary coded digital form are supplied to respective x and y function generators 41 and 42. The construction of these function generators is illustrated in FIG. 7A wherein it will be seen that each function generator comprises nothing more than a conventional, commercially available digital to analog converter 43 for converting the digital x or y address signal into a corresponding analog voltage $v_x$ or $v_y$. This analog voltage $v_x$ or $v_y$ then is supplied through a conventional inverting amplifier shown at 44 for converting the deflection voltages to their negative counterpart $-v_x$ or $-v_y$.

The outputs $v_x$, $-v_x$ of the x function generator 41 and the outputs $v_y$ and $-v_y$ of the y function generator 42 are supplied in parallel to the inputs of an "a" ratio multiplier 45 to be described hereinafter and to four of the inputs of a mixer circuit 46 also to be described hereinafter. The output $v_x$ of x function generator 41, and the output $v_y$ of the y function generator 42 also are supplied as the two inputs to a quadrupole-octupole correction voltage generator whose construction and operation will be described more fully in the following paragraph, and also are supplied as two inputs to the dynamic focus generator 22 shown in FIG. 1 of the drawings.

Figure 5:
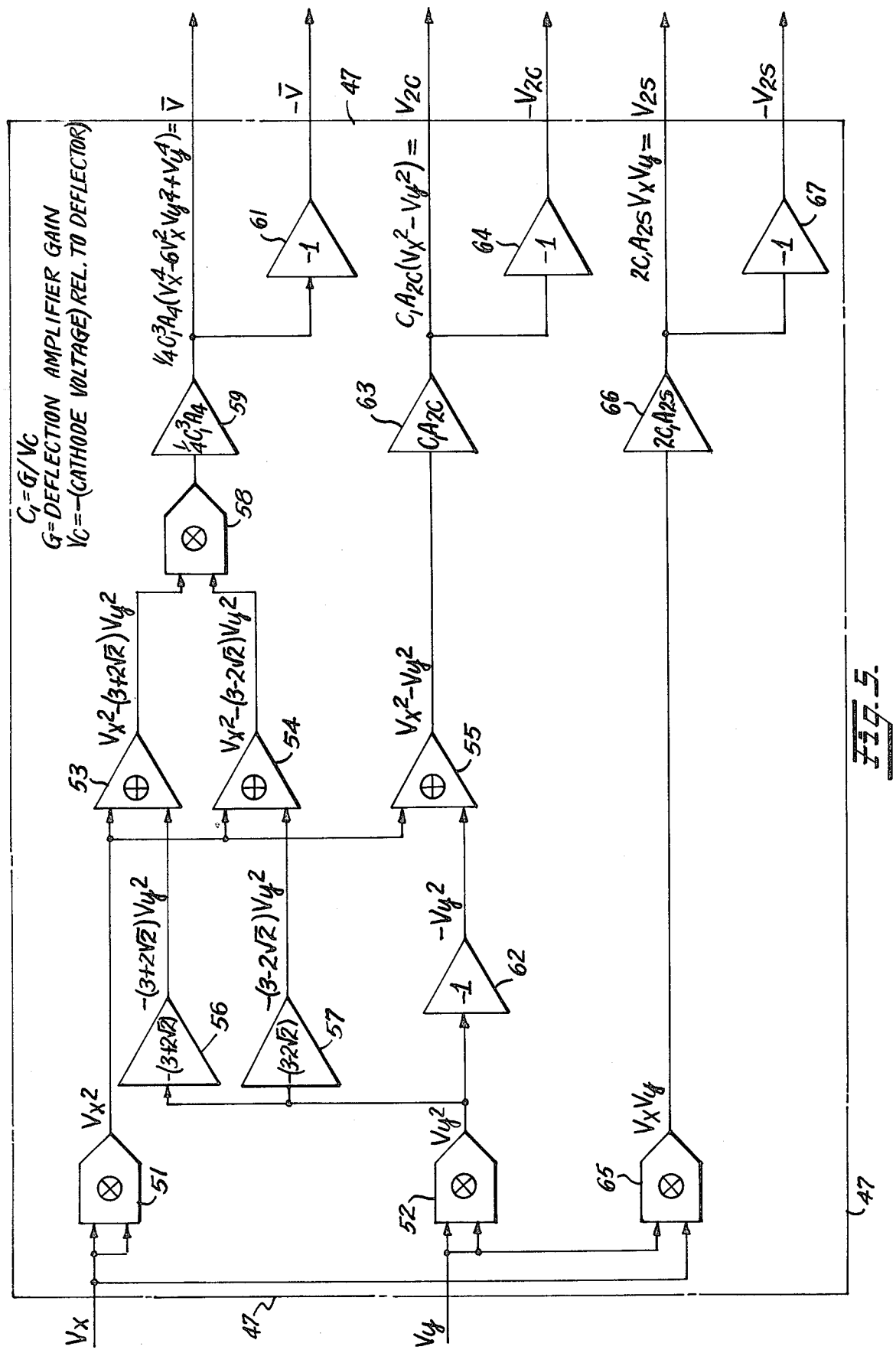
FIG. 5 is a functional block diagram of a novel quadrupole-octupole correction voltage generator comprising a part of the invention and included in the eight-fold deflection-correction voltage generator shown in FIG. 4.

The heart of the new and improved dynamic correction system for the electrostatic deflector of an electrostatic type electron beam tube apparatus is the quadrupole-octupole correction voltage generator 47 whose construction is shown in FIG. 5 of the drawings. In FIG. 5 the x axis deflection voltage $v_x$ is supplied in parallel to both input terminals of a first multiplier amplifier 51 and the y axis deflection voltage $v_y$ is supplied in parallel to both input terminals of a second multiplier amplifier 52. The multiplier amplifiers 51 and 52 comprise conventional, commercially available integrated circuit operational amplifiers which are connected so as to operate as multipliers of the two input signals applied thereto in a known manner as taught by the manufacturer's instructions. Thus, in first multiplier 51 the deflection voltage $v_x$ is multiplied by itself to derive at the output a signal $v_x^2$ and in the second multiplier 52 the deflection signal $v_y$ is multiplied by itself to derive a signal $v_y^2$. The $v_x^2$ signal is supplied in parallel to an input terminal of respective summing amplifiers 53 and 54, and also is applied to an input terminal of a third summing amplifier 55 to be discussed hereafter. The summing amplifier 53–55 each comprise conventional, commercially available integrated circuit operational amplifiers which are interconnected in a known manner as taught by the manufacturer's instructions to operate as summing amplifiers for summing together two input signals applied to separate summing input terminals of each of the amplifiers. The $v_y^2$ output signal from the second multiplier 52 is supplied in parallel to the input of respective operational amplifiers 56 and 57 whose outputs are supplied to summing point terminals of the respective summing amplifiers 53 and 54. The operational amplifiers 56 and 57 comprise conventional, commercially available integrated circuit operational amplifiers whose circuit parameters are proportioned in a known manner as taught by the manufacturers of the device to provide these amplifiers with transfer functions having the values $-(3 + 2\sqrt{2})$ and $-(3 - 2\sqrt{2})$ whereby at the output of each of the operational amplifiers 56 and 57, signals are derived having the value $-(3 + 2\sqrt{2})v_y^2$ and $-(3 - 2\sqrt{2})v_y^2$, respectively. These output signals are supplied to the remaining summing input terminals of the first and second summing amplifiers 53 and 54 which sums these signals with the $v_x^2$ signals supplied to their other summing input terminals and derives respective output signals having the value $v_x^2 - (3 + 2\sqrt{2})v_y^2$ and $v_x^2 - (3 - 2\sqrt{2})v_y^2$. These two signals are multiplied together in a third multiplier 58 of conventional construction, and the product thereof supplied to an operational amplifier 59 of conventional construction which has designed into it the transfer function $\frac{1}{4} C_1^3 A_4$ where $C_1 = G/V_c$ and $G$ = deflection amplifier gain and $-V_c$ = cathode voltage of the electron gun measured with respect to the deflector voltage while the deflector is not deflecting the electron beam. At the output from the operational amplifier 59, an octupole correction potential $\overline{v}$ is obtained wherein $$\overline{v} = \tfrac{1}{4} C_1^3 A_4 (v_x^4 - 6v_x^2 v_y^2 + v_y^4). \tag{3}$$

An inverting amplifier 61 of conventional, commercially available construction is connected to the output from the operational amplifier 59 for deriving the negative octupole correction potential $-\overline{v}$.

The functional form of the octupole correction potential (3), as well as the two quadrupole correction potentials, follows from the symmetry of the eight-fold deflector and the square (or circular) field which it covers. Also allowed by symmetry are higher-order terms (proportional to $v_x^6, v_x^4, v_y^2, \ldots v_x^{10}, \ldots$) which slightly improve the correction at the cost of added complexity. The octupole constant $A_4$, as well as the quadrupole constants $A_{2C}$ and $A_{2S}$, are constants which can be determined empirically or by computer simulation and are determined essentially by the physical parameters of the eight-fold deflector assembly such as the inlet diameter $D_1$, the outlet diameter $D_2$, the frustum length L, the target spacing $Z_s$, etc., as shown in FIG. 2A and is well known to those skilled in the art. If the field accessed by the deflector is a circle, then from symmetry considerations $A_{2C} = A_{2S}$. The factor $C_1$ essentially comprises a scaling factor for making the constant $A_4$ as well as two other constants $A_{2C}$ and $A_{2S}$ employed in the quadrupole correction voltages universally useable with different cathode voltages $v_c$ and different amplifier gains G.

The quadrupole-octupole correction value generator 47 further includes quadrupole correction voltage generator means comprised in part by the second multiplier amplifier 52 whose $v_y^2$ output is supplied through an inverter amplifier 62 of conventional construction to derive an output signal $-v_y^2$. The signal $-v_y^2$ is applied to a second input terminal of the third summing amplifier 55 having $v_x^2$ applied to its other input terminal. Summing amplifier 55 serves to sum together these two input signals and derive at its output a signal $v_x^2 - v_y^2$. This signal is supplied through a fourth operational amplifier 63 of conventional construction having a transfer function $C_1 A_{2C}$ which derives at its output one of the quadrupole correction voltages $v_{2C} = C_1 A_{2C} (v_x^2 - v_y^2)$. An inverter circuit 64 connected to the output of operational amplifier 63 serves to invert $v_{2C}$ to derive the negative quadrupole correction potential $-v_{2C}$.

The quadrupole-octupole correction voltage generator 47 shown in FIG. 5 further includes a fourth amplifier circuit means 65 of conventional, commercially available construction having its input terminal connected respectively to the $v_x$ and $v_y$ deflection voltages derived from the output of the x and y function generators. Multiplier 65 serves to multiply the $v_x$ and $v_y$ input signals and derive at its output a signal $v_x v_y$. This signal is supplied through an operational amplifier 66 of conventional commercially available construction having designed into it the transfer function $2C_1 A_{2S}$ and which derives at its output a second quadrupole correction potential $v_{2S} = 2C_1 A_{2S} v_x v_y$. An inverting amplifier 67 of conventional construction is connected to the output of operational amplifier 66 and converts this quadrupole correction signal to provide its negative counterpart $-v_{2S}$.

Referring back to FIG. 4 of the drawings, it will be seen that each of the octupole and quadrupole correction potentials derived at the output of the quadrupole-octupole correction voltage generator 47 is supplied to an input terminal of the mixer circuit means 46. These quadrupole and octupole correction voltages are denoted by $v_{2C}, -v_{2C}, v_{2S}, -v_{2S}, \overline{v}$, and $-\overline{v}$ and are in addition to the deflection voltages $v_x, -v_x, v_y$ and $-v_y$ and the four voltages supplied from the output of an "a" ratio multiplier circuit 45. The "a" ratio multiplier circuit 45 is shown in FIG. 7B of the drawings and is comprised of a plurality of individual, operational amplifiers 71–74 of conventional, commercially available integrated circuit construction each of which has a transfer function characteristic "a." "a" is the fraction of the x axis and y axis deflection potentials which is to be supplied to the diagonally located deflector members such as 2, 4, 6 and 8 as shown in FIG. 2 of the drawings. Because of the symmetry of the geometric configuration of the eight-fold deflector structure, this ratio is the same for all diagonal deflector members and is designed into the transfer function of each of the operational amplifiers 71–74. The input x and y deflection potentials are multiplied by the ratio "a" in the respective differential amplifiers 71–74 to derive at the output of the "a" ratio multiplier circuit 45 the potentials $av_y, -av_y, av_x$ and $-av_x$. These potentials then are supplied as additional inputs to the mixer circuit 46. The numerical value of "a" should be substantially $\sqrt{2}/2$, since for that value the third and fifth harmonics of the potential vanish and hence the field in the deflector is nearly uniform. Slight improvement in performance may be obtained by small deviations from this value, which can be determined empirically or by computer simulation. If the field is a circle, $a = \sqrt{2}/2$ exactly.

The construction of the mixer circuit 46 is shown in FIG. 6 of the drawings wherein it will be seen that the mixer circuit comprises a plurality of interconnected summing amplifiers. A first set of input stage summing amplifiers is comprised by the summing amplifiers 81-84 of conventional, commercially available integrated circuit construction. The summing amplifier 81 has supplied to its two summing input terminals the signals $av_y$ and $av_x$ and derives at its output terminal the signal $av_x + av_y$. The summing amplifier 82 sums together two input signals $-av_y$ and $av_x$ to derive at its output the signal $av_x - av_y$. The summing amplifier 83 sums together the two input signals $-av_x$ and $-av_y$ to derive at its output the signal $-av_x - av_y$. The summing amplifier 84 sums together two input signals $av_y$ and $-av_x$ to derive at its output the signal $-av_x + av_y$. A second set of input stage summing amplifiers is comprised by the summing amplifiers 85-88 also of conventional, commercially available integrated circuit construction. The summing amplifier 85 sums together the input signals $\overline{v}$ and $v_{2s}$ to derive at its output a signal $v_{2s} + \overline{v}$. Summing amplifier 86 sums together the two input signals $-\overline{v}$ and $v_{2c}$ and derives at its output the signal $v_{2c} - \overline{v}$. Summing amplifier 87 sums together the two input signals $-v_{2c}$ and $-\overline{v}$ to derive at its output a signal $-v_{2c} - \overline{v}$. Summing amplifier 88 sums together the two input signals $-v_{2s}$ and $\overline{v}$ to derive at its output a signal $-v_{2s} + \overline{v}$.

The mixer circuit 46 is completed by a set of output stage summing amplifiers 91-98 of conventional, commercially available integrated circuit construction. The summing amplifier 91 sums together the input signal $v_x$ with the signal $v_{2c} - \overline{v}$ appearing at the output of the input summing amplifier 86 to derive at its output a combined deflection and correction potential $v_x + v_{2c} - \overline{v} = v_1$. Summing amplifier 92 sums together the signal $av_x + av_y$ from the input stage amplifier 81 and the signal $v_{2s} + \overline{v}$ from the input stage amplifier 85 to derive an output deflection and correction potential $av_x + av_y + v_{2s} + \overline{v} = v_2$. Summing amplifier 93 sums together an input deflection potential $v_y$ and the output signal from the second input stage summing amplifier 87 $-v_{2c} - \overline{v}$ to derive an output deflection and correction potential $v_y - v_{2c} - \overline{v} = v_3$. Summing amplifier 94 sums together the output signals from the first input stage amplifier 84 and the second input stage amplifier 88 to derive at its output a combined deflection and correction potential $-av_x + av_y - v_{2s} + \overline{v} = v_4$. Summing amplifier 95 sums together the $-v_x$ deflection potential with the output from the second stage input amplifier 86 to derive at its output the deflection and correction potential $-v_x + v_{2c} - \overline{v} = v_5$. Output stage summing amplifier 96 sums together the output signals from the first stage input amplifier 83 and the second stage input amplifier 85 to derive at its output the deflection and correction potential $-av_x - av_y + v_{2s} + \overline{v} = v_6$. Summing amplifier 97 sums together the negative axis deflection potential $-v_y$ and the output signal from the second stage input summing amplifier 87 to derive at its output terminal a deflection and correction potential $-v_y - v_{2c} - \overline{v} = v_7$. Finally, output stage summing amplifier 98 sums together the output from the first stage input summing amplifier 82 and the output from the second stage input amplifier 88 to derive at its output the deflection and correction potential $av_x - av_y - v_{2s} + \overline{v} = v_8$. A comparison of the deflection and correction potentials derived from the outputs of the mixer shown in FIG. 6 to those shown at the output of the mixer 46 in FIG. 4 will reveal that the sets of deflection and correction potentials are identical in value.

Returning now to FIG. 1 of the drawings, it will be seen that the combined deflection and correction potentials $v_1$ through $v_8$ appearing at the output of the eight-fold deflection correction voltage generator 21 are supplied as the input to the bank of deflection amplifiers 19. The deflection amplifiers 19 are shown in FIG. 7 of the drawings and comprise a plurality of identical individual operational amplifiers 101-108, each of which consists of a conventional, commercially available integrated circuit operational amplifier followed by a conventional discrete transistor or vacuum tube output stage, designed to provide a gain G. The gain G of the operational amplifiers 101-108 is the gain factor G employed in the expression $C_1 = G/V_c$ for deriving the constant $C_1$ employed in the quadrupole-octupole correction voltage generator 47 to derive the octupole and quadrupole correction voltages. Each of the amplifiers 101-108 amplify the input combined deflection and correction voltages $v_1$-$v_8$ by the respective gain factor G to derive at their output terminal the respective amplified combined deflection and correction voltages $V_1$-$V_8$ for application to the deflector members of the eight-fold deflector assembly as shown in FIG. 2 of the drawings.

In addition to the deflection and correction potentials derived as described above, dynamic focusing correction to the supply potential applied to the objective lens assembly of the electron beam tube, is achieved by dynamic focus generator 22 as shown in FIG. 1 of the drawings. The dynamic focus generator 22 has supplied to it both the $v_x$ and $v_y$ deflection potentials obtained from the output of the x and y function generators in the eight-fold deflection-correction voltage generator 21 together with an objective lens direct current voltage $V_{OBJ(0)}$ supplied from a supply source 23 that in turn derives its voltage from the electron gun power supply 14. The dynamic focus generator 22 operates to correct the uncorrected objective lens d.c. supply voltage $V_{OBJ(0)}$ and to derive at its output a dynamically corrected objective lens supply voltage $V_{OBJ(c)}$ that is supplied to the objective lens assembly 16 of the respective electron beam tubes 11 employed in the EBAM system.

FIG. 7D illustrates the construction of the dynamic focus generator 22. It comprises a pair of input multiplier amplifiers 111 and 112 of conventional, commercially available integrated circuit construction. The $v_x$ deflection voltage is supplied as the input to the multiplier 11 for multiplication by itself to derive at the output of multiplier 111 a signal $v_x^2$. Similarly, the deflection voltage $v_y$ is supplied as an input to the multiplier 112 for multiplication by itself to derive at the output a signal $v_y^2$. An operational amplifier 113 of conventional construction having a transfer function $C_2 A_{DF}$ is connected in the output of the multiplier 111 for deriving at its output a signal $C_2 A_{DF} v_x^2$ where the value $C_2 = C_1 G = G^2/V_c$ is a constant scaling factor, and $A_{DF}$ is a constant. Similarly, an operational amplifier 114 of conventional, commercially available construction and having the same transfer function $C_2 A_{DF}$ is connected in the output of the multiplier 112 for deriving at its output a signal $C_2 A_{DF} v_y^2$. The two signals $C_2 A_{DF} v_x^2$ and $C_2 A_{DF} v_y^2$ are summed together in a summing amplifier 115 of conventional, commercially available construction to derive a correction potential $C_2 A_{DF} (v_x^2 + v_y^2) = A_{DF}(V_x^2 + V_y^2)/V_c$. This correction potential is applied as one of the inputs to a second summing amplifier stage 116 of conventional, commercially available construction. The summing amplifier 116 has supplied to its remaining summing point terminal the uncorrected objective lens supply voltage $V_{OBJ(0)}$ and derives at its output a dynamic focusing potential $V_{OBJ(c)}$ for supply to the objective lens assemblies of all of the electron beam tubes where $V_{OBJ(0)} + A_{DF}(V_x^2 + V_y^2)/V_c = V_{OBJ(c)}$ which is the corrected objective lens supply potential. The constant $A_{DF}$ can be determined either empirically or by computer simulation, and is determined essentially by the physical parameters of the eight-fold deflector assembly and by the voltage dependence of the focal plane position of the objective lens assemblies 16. The factor $C_2$ essentially comprises a scaling factor for making the constant $A_{DF}$ universally useable with different cathode potentials $V_c$ and different amplifier gains G.

Experimental verification of the apparatus described with relation to FIG. 1 of the drawings was obtained with a 7Y series EBAM tube developed by the Micro-Bit Corporation employing an eight-fold deflector with combined deflection and two quadrupole and an octupole correction potentials applied thereto according to the invention and the results obtained were in substantial agreement with computer simulation of the apparatus at all sides and corners of a square target field being accessed on the target plane, and within the accuracy of plus or minus 10% of the electron beam spot diameter. In this particular apparatus, the following values for the constants were employed:

$$a = \sqrt{2}/2, A_{2c} = A_{2s} = 0.37 \text{ and } A_4 = 3.05 \times 10^4$$

and when used in conjunction with a dynamic focusing potential correction with $A_{DF} = 5.5$ resulted in a normalized spot aberration coefficient of $A_d = 1.1$, compared with $A_d = 4.0$ with dynamic focusing but without quadrupole-octupole correction.

FIG. 3 is a schematic functional block diagram of a preferred form of an array optics EBAM system constructed according to the invention wherein compound fly's-eye type electron beam tubes 121 are employed to greatly increase the storage capacity of the EBAM system. As shown in FIG. 3, the compound fly's-eye type electron beam tubes 121 are identical in construction and operation so that only one of the tubes need be described. Each compound, fly's-eye type electron beam tube is comprised by an outer evacuated housing member 121 of a glass, steel or other impervious material in which is mounted an electron gun 122 having a dispenser type cathode 122a, a grid 122b, and an anode 122c for producing a beam of electrons indicated generally at 13. Although dispenser type cathodes have been described for both simple optics and array optics systems, it is believed obvious to one skilled in the art that field emission type cathodes could be employed to obtain desired beam current magnitudes. The beam of electrons 13 is projected through a collimating lens assembly 123 mounted within evacuated housing 121 and comprises a stacked array of apertured metallic members for centering and collimating the beam of electrons 13 and projecting it into an eight-fold coarse deflector assembly shown at 17a and 17b. In FIG. 3, it will be seen that the eight-fold coarse deflector assembly is separated into two different sections 17a and 17b. Each of the sections is essentially similar in construction to the eight-fold deflector assembly described with relation to FIG. 1 with the exception that the second section 17b is designed to have larger inlet and outlet diameters for the frusto-conical shaped deflector assembly than is true to the first section 17a as illustrated in both FIG. 3 and FIG. 3A of the drawings. The first section 17a deflects the beam of electrons at an angle away from the center axis of the electron beam which essentially is identified by the center axis of the collimating lens assembly 123. The second section 17b has the same voltages applied to it as the first section 17a, but the voltages are rotated 180° so that the second section deflects the electron beam back towards and parallel to the center axis of the tube. The relative lengths of the two sections 17a and 17b are chosen so that the electron beam leaving the second section 17b is again parallel to the center axis of the tube (and hence the center axis of the electron beam). If desired, fine tuning may be achieved by multiplying the voltage supplied to the second section deflector members by an adjustable factor "b" as will be described more fully hereafter.

The electron beam which has been deflected by the eight-fold coarse deflector assembly 17a and 17b exits the eight-fold coarse deflector assembly at a physically displaced location which is in substantial axial alignment with a desired one of a planar array of a plurality of fine deflector lenslets shown at 124 after first passing through an objective lenslet array assembly shown at 125. The objective lenslet array assembly 125 is of the Einzel unit potential type to facilitate operation of all deflection and target signals at d.c. ground potential. The assembly consists of three aligned conductive plates each having a 32 × 32 array of holes plus extra holes around the periphery to preserve field symmetry. Lens tolerances, particularly the roundness of the holes, is controlled to very tight limits in order to minimize aberrations introduced by the assembly. Each of the 32 × 32 array of holes defines a fine lenslet which is followed by the fine deflector assembly 124 for deflecting the electron beam which passes through a selected one of any of the individual 32 × 32 lenslets to impinge on a predetermined x-y planar area of the target element 18.

The fine deflector assembly 124 is comprised of two successive arrays of parallel bars 124a and 124b which extend at right angles to each other as shown in FIG. 9 to achieve necessary x-y deflection of the electron beam over preassigned areas of the target surface for a given lenslet. Mechanical tolerances are not stringent since the structureless MOS target element 18 allows for considerable variation in deflection sensitivity. However, stability of construction is important to minimize sensitivity to vibrations.

The target element 18 in the array optics EBAM system of FIG. 3 is similar to the MOS target element 18 used in the system shown in FIG. 1 but is much larger in area (4 × 4 centimeters). The target element 18 used in the FIG. 3 system incorporates sufficient electrical segmentation to reduce the capacitance of each segment to a value compatible with high operational speeds (of the order of 5 megahertz read-write). The bit packing density of the target element has been shown to extend at least down to 0.6 microns. The combination of the coarse deflector system which allows the electron beam to address a 32 × 32 array of fine lenslets, and the fine x-y deflector for each lenslet comprised by the transverse bar arrays 124a and 124b which can address a 750 × 750 array of spots in each lenslet field, greatly increases the capacity of the array optics EBAM system. This is in contrast to the simple EBAM system shown in FIG. 1 which is capable of addressing only a single 4K × 4K bit field. Consequently, the total addressing capability of the array-optic system shown in FIG. 3 is almost 6 hundred million spots in each EBAM tube which in fact can be expanded further by more rigorous measures to even a larger number of addressable spots on the target element. The number of EBAM tubes included in an EBAM system of the array-optic type then would determine the total capacity of the memory system.

The requirements on a coarse deflector system such as 17a, 17b of FIG. 3 are first, that the electron beam must exit the coarse deflector system parallel to the electron beam tube center axis, in order to avoid degrading the performance of the array of fine lenslets by off-axis rays. Additionally, the virtual object of the coarse deflector system (i.e. projection of the exit rays to the smallest virtual focus) must not move off of the system axis as the deflection voltage is varied, in order to avoid movement of the image of each fine lenslet in the 32 × 32 fine lenslet array thereby avoiding the need for ultra-stable cathode-deflector voltage sources. Finally, the virtual object from a set of radial rays and from a set of circumferential rays must coincide at the outlet of the coarse deflector system, in order to avoid astigmatism. These three conditions can all be met if and only if the coarse deflector is in a collimating mode (i.e. the bundle of rays entering the deflector are parallel to the system axis and exit the deflector parallel to the axis but displaced radially sufficiently to be aligned with a desired fine lenslet in the fine array-optics system). Approximate collimation is achieved by either a double deflector system as shown in FIGS. 3 and 3A connected electrically as shown in FIGS. 3B and 3C or by use of a twisted deflector as shown in FIG. 10, with or without the use of a magnetic field such as described in an article entitled "Electron Trajectory in Twisted Electro-Static Deflection Yokes" by E. F. Ritz reported in IEEE Transactions, Electron Devices, ED-20, 1042, November, 1973. In the twisted deflector method, there is only one section, with the plates of the section forming a spiral pattern as best shown in FIG. 10. Deflection and collimation take place simultaneously as the beam travels through the twisted deflector. Total twist angle for collimation of the output depends on the axial magnetic field superimposed upon the deflector as described in the above-referenced IEEE Transaction article of November, 1973. Because of its greater simplicity of fabrication, the double deflector method is preferred in which an eight-fold deflector is employed in each section and in which the basic deflector sections consist of eight flat or curved plates, arrayed in either plate-centered (PC) configuration as shown in FIG. 2 or a gap-centered (GC) configuration as shown in FIG. 14.

The "a" ratio is defined as the fraction of x and y voltages applied to the diagonal plates for PC and the fraction of y-voltage applied to the x-plate and vice-versa for GC. If "a" is chosen to be $\sqrt{2}/2$ for PC deflectors and $\sqrt{2}-1$ for GC deflectors, then, as with the single eight-fold deflector of a simple optics system as shown in FIG. 1, the 3rd and 5th harmonics of the potential varnish, and the field is highly uniform, providing typical miscollimation of only about 10 milliradians. Whereas miscollimation of the order of 10 milliradians is acceptable in some applications, if high resolution is required from the array lens (i.e. spot size of the order of a micron or less) then collimation is needed to within the order of 1 milliradian over the entire lenslet array and 50 microradians over the beam at each lenslet. Such a highly corrected coarse deflection can be achieved by applying quadrupole and octupole correction voltages to the two eight-fold deflector sections, as shown in FIG. 3. An alternative is to use a twisted eight-fold deflector, as shown in FIG. 10, with quadrupole and octupole correction voltages applied to achieve a high degree of correction.

In the coarse double deflector system shown in FIG. 3, both sections of the double deflector must have opposite polarity deflection voltage but the same correction voltage on corresponding plates since these correction voltages have even symmetry. If desired, the voltage on the second section deflector members may be multiplied by an adjustable factor "b" if fine tuning is desired as will be described hereafter with respect to FIGS. 11–13. Reversal of the deflection voltages but not the correction voltages (without fine voltage tuning) is achieved by cross wiring the respective deflector members of the two deflector sections in the manner shown in FIGS. 3B and 3C. By tracing through the inter-connections shown in FIG. 3B, or from a review of the chart shown in FIG. 3C, it will be seen that deflector member 1 of the first deflector section is connected to deflector member 5 in the second section, 2-6, 3-7, 4-8, 5-1, 6-2, 7-3 and 8-4. By this means, the necessary 180° rotation between deflection and correction voltages applied to the first and second sections of the coarse deflection assembly, is achieved.

As best seen in FIG. 3 of the drawings, the required combined deflection and correction voltages $V_1$–$V_8$ are supplied directly to the respective deflector members of the first eight-fold coarse deflector section 17a from the output of the coarse deflector amplifiers 19 which in turn are supplied from the output of an eight-fold (coarse) deflection-correction voltage generator 21 similar to that described with relation to FIG. 4 of the drawings. The eight-fold (coarse) deflection-correction voltage generator 21 shown in FIG. 3, however, is supplied with the coarse x and y address from the controller of the system. The fine x and y address is supplied separately from the controller to a four-fold (fine) deflector voltage generator 131 for deriving the output fine x and y deflection voltages $v_{Fx}$, $v_{Fy}$, $-v_{Fx}$ and $-v_{Fy}$. In addition, the fine deflector voltage generator 131 supplies the deflection voltages $v_{Fx}$, $v_{Fy}$ to a dynamic focus generator 22 similar in construction and operation to the dynamic focus generator described with relation to FIG. 7D of the drawings, except that the constant $A_{DF}$ becomes two different constants $A_{DFx}$ and $A_{DFy}$ in the operational amplifiers 113 and 114, respectively, so that $V_{OBJ(c)} = V_{OBJ(0)} + (A_{DFx} V_{Fx}^2 + A_{DFy} V_{Fy}^2)/V_c$. This anisotropy is necessary because the fine deflector breaks x-y symmetry. As a consequence of this arrangement, it will be seen that the uncorrected objective lens supply voltage $V_{OBJ(0)}$ obtained from the objective lens voltage supply 23 is corrected in proportion to the fine x and y deflection voltages $V_{Fx}$ and $V_{Fy}$ in the dynamic focus generator to thereby derive the corrected objective lens supply voltage $V_{OBJ(c)}$ for application to the objective lens array 125 in each of the compound, fly's-eye type EBAM tubes 121 used in the EBAM system.

Figure 8:
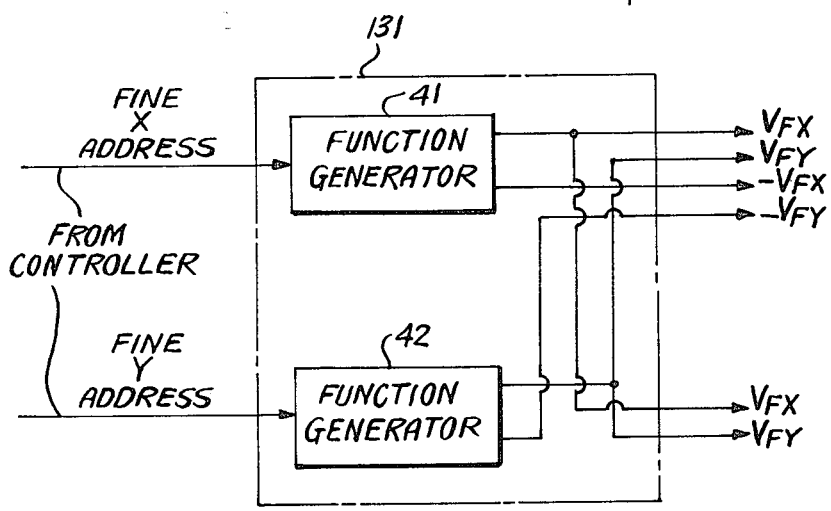
FIG. 8 is a functional block diagram of a four-fold fine deflection voltage generator used in the system of FIG. 3.

FIG. 8 illustrates the construction of the four-fold (fine) deflector voltage generator 131 wherein it can be seen that this generator comprises a pair of x and y function generators 41 and 42 similar in construction to the function generator described with relation to FIG.

7A. The function generator 41 in response to an input fine x address in digital form from the controller of the EBAM system, derives at its output the deflection voltages $v_{Fx}$ and $-v_{Fx}$. Similarly, the function generator 42 in response to the fine y address derives the fine y axis deflection voltages $v_{Fy}$ and $-v_{Fy}$. As shown in FIG. 3, these deflection voltages are amplified in fine deflection amplifiers 132 to derive the fine deflection voltages $V_{Fx}$, $V_{Fy}$, $-V_{Fx}$ and $-V_{Fy}$ which are applied to the fine x and y deflector bars 124a and 124b of the fine deflector assembly 124 of each of the EBAM tubes 121. The fine deflection amplifiers 132 are similar in construction to the deflection amplifiers shown in FIG. 7C of the drawings and operate to amplify the input fine deflection voltages by a gain factor $G_F$ to derive the output amplified deflection voltages that are applied to the fine deflector assemblies of the respective EBAM tubes. In this regard, it should be noted that in the system of FIG. 3, it is the gain factor $G_F$ of the fine deflector amplifiers which is employed in deriving the constant $C_2$ used in the operation of the dynamic focus generator 22 wherein $C_2 = G_F^2/V_c$. However, the constant $C_1$ employed in operation of the quadrupole-octupole correction voltage generator of the eight-fold (coarse) deflector correction voltage generator 21 would continue to be the gain factor G of the coarse deflection amplifiers 19, divided by minus the cathode voltage $V_c$, as explained previously with respect to the FIG. 1 system.

An EBAM tube was built using a two section circular-conical deflector assembly identified (as CD3-54-0) as shown in FIGS. 3, 3A, 3B wherein the first eight-fold deflector section of the coarse deflector had a cone length of 3.5 inches, an entrance diameter of 1.0 inches and an exit diameter of 1.8 inches and the second eight-fold deflector section had a cone length entrance diameter and exit diameter dimensions of 7.5 inches, 1.8 inches, and 3.5 inches, respectively. The assembly had a miscollimation over the entire lenslet array of 12 milliradians uncorrected and 1 milliradian with correction as taught by the present invention, thus providing an improvement in operation by a factor of 12.

FIG. 11 is a functional block diagram of an alternative form of eight-fold deflector voltage generator 21 suitable for use in practicing the invention. The eight-fold deflector voltage generator shown in FIG. 11 is similar in many respects to that shown in FIG. 4 of the drawings but differs therefrom in that it includes a modified function generator 40 to be described more fully hereinafter with respect to FIGS. 12 and 13 of the drawings. In addition, the alternative eight-fold deflector voltage generator 21 shown in FIG. 11 includes a further feature of providing the option of fine tuning to the deflection and correction potentials applied to the second stage deflector members of the coarse deflector shown in FIGS. 3 and 3A of the drawings. In this arrangement, each of the combined deflection and correction potentials $v_1$ through $v_8$ appearing at the output of the mixer 46 is supplied through a respective operational amplifier 146 for multiplying the voltages to be applied to the second section of the coarse deflector by an adjustable factor b to thereby develop the voltages $v_1' = bv_5$, $v_2' = bv_6$, $v_3' = bv_7$, $v_4' = bv_8$, $v_5' = bv_1$, $v_6' = bv_2$, $v_7' = bv_3$ and $v_8' = bv_4$ as depicted in the chart shown in FIG. 3C of the drawings. The deflection voltages $v_1'$-$v_8'$ then are applied to the second section deflector plates 1'-8' after amplification in a suitable bank of coarse deflection amplifiers 19A as shown in FIGS. 3 and 7C of the drawings. The adjustable factor "b" is proportioned to provide the best achievable collimation with a given coarse deflector structure. However, it is clearly preferable to design the coarse deflector such that collimation is achieved with cross-wiring, as in FIG. 3B, so that the "b" section in FIG. 11 (outputs $v_1'$ to $v_8'$) is not used.

The construction of the modified function generator 40 used in the alternate eight-fold deflector voltage generator 21 of FIG. 11 is illustrated in FIG. 12 of the drawings. Referring to FIG. 12, it will be seen that the input, x and y address information in digital data form is applied respectively to the inputs of an x-axis digital to analog converter $43_x$ and a y-axis digital to analog converter $43_y$ to derive output analog voltages representative of the x and y axes location on the target plane $v_{xo}$ and $v_{yo}$. These analog deflection voltages are then supplied to a nonlinear correction voltage generator 150 to derive at its output the required corrected deflection voltages $v_x$ and $v_y$. By supplying the deflection voltages through inverter amplifiers $44_x$ and $44_y$, the corresponding opposite-polarity deflection voltages $-v_x$ and $-v_y$ are derived.

The nonlinear correction voltage generator 150 whose construction is shown in FIG. 13 operates to improve the linearity of the actual deflection field (by compensating for intrinsic deflector nonlinearity) and to thereby more faithfully locate the electron beam in response to input x and y addresses. For this purpose, the analog voltages $v_{xo}$ and $v_{yo}$ appearing at the output from the digital to analog converters $43_x$ and $43_y$, are processed through the nonlinear correction voltage generator 150. The voltages $v_{xo}$ and $v_{yo}$ are applied to the two inputs of multiplier amplifiers 151 and 152, respectively, for deriving the output signals $v_{xo}^2$ and $v_{yo}^2$, respectively. The signal $v_{xo}^2$ is applied as an input to two operational amplifiers 153 and 154 having gain functions $g_{01}$ and $g_{10}$, respectively. Similarly, the output signal $v_{yo}^2$ is applied to the inputs of two operational amplifiers 155 and 156 having gains $g_{10}$ and $g_{01}$, respectively where gains $g_{10}$ and $g_{01}$ are proportioned to provide the improved linearity. The output signals of amplifiers 153 and 155 having values $g_{01} v_{xo}^2$ and $g_{10} v_{yo}^2$ are then applied as the two inputs to a summing amplifier 157 whose output is applied to an input of a second summing amplifier 159. Similarly, the outputs of the amplifiers 154 and 156, $g_{10} v_{xo}^2$ and $g_{01} v_{yo}^2$ are applied as the two inputs of a summing amplifier 158 whose output is supplied as one of the inputs to a fourth summing amplifier 160. Each of the summing amplifiers 159 and 160 have applied to the remaining input terminals a signal value equal to 1. Consequently, the summing amplifier 159 derives at its output a signal $1 + g_{01} v_{xo}^2 + g_{10} v_{yo}^2$ which is applied as one of the input signals to a multiplier 161. Similarly, the summing amplifier 160 derives at its output a signal $1 + g_{01} v_{yo}^2 + g_{10} v_{xo}^2$ which is applied as an input to a second multiplier amplifier 162. The multiplier amplifiers 161 and 162 have applied to a remaining input terminal thereof the input $v_{xo}$ and $v_{yo}$ signals, respectively, and derive at their output terminals the corrected $v_x$ and $v_y$ deflection signals wherein $v_x = v_{xo}(1 + g_{01} v_{xo}^2 + g_{10} v_{yo}^2)$ and $v_y = v_{yo}(1 + g_{01} v_{yo}^2 + g_{10} v_{xo}^2)$. These corrected deflection signals along with the inverted version of the signals $-v_x$ and $-v_y$ are then supplied to mixer 46 as described previously with relation to the FIG. 4 deflector voltage generator. Correction of the X and Y analog address signals applied to the deflector plates of the eight-fold deflector assembly in this manner assures that the voltages will more faithfully deflect the electron beam of the EBAM tube to the x-y address location called for by input digital X and Y address signals. This nonlinear correction may be used with either the double deflector of an array optics system (FIG. 3) or the single deflector of a simple optics system (FIG. 1).

Figure 15:
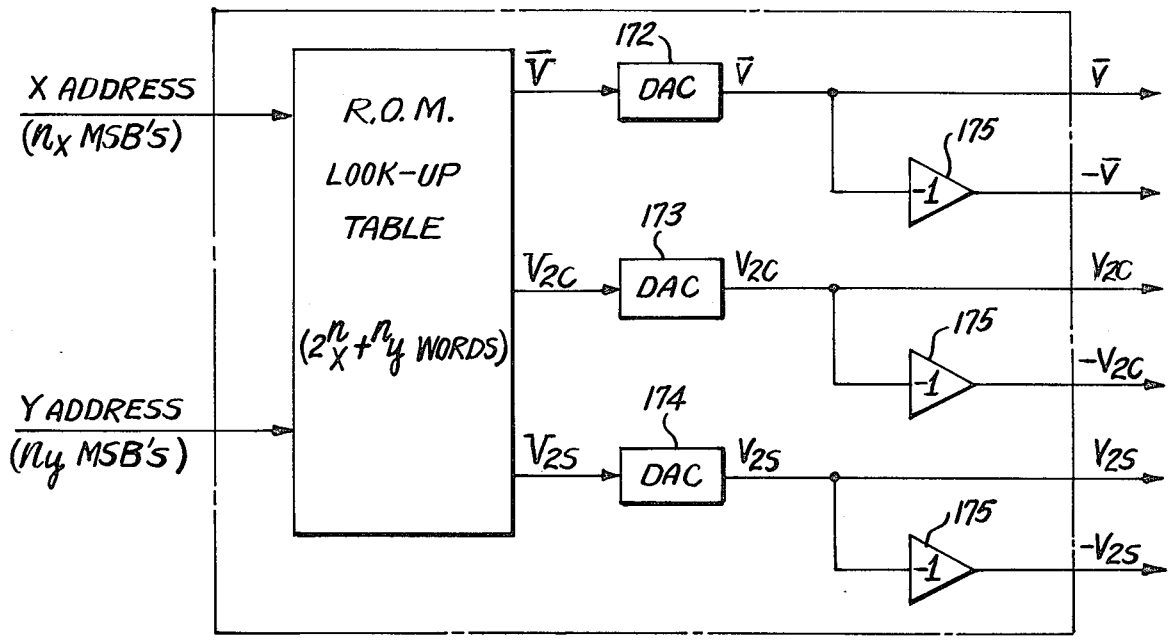
FIG. 15 is a functional block diagram of a digital quadrupole-octupole generator for use with the digital system of FIG. 14.

FIG. 14 is a functional block diagram illustrating still another suitable form of eight-fold deflector voltage generator wherein digital data processing is employed to derive the desired correction voltages. As shown in FIG. 14, the preferred digital version of the eight-fold deflector generator is substantially similar to that shown and described with relation to FIG. 11 of the drawings except that it employs a digital quadrupole-octupole correction voltage generator 147 which has supplied to it the input digital X and Y address signals over input conductors 170. The construction of the digital quadrupole-octupole correction voltage generator 147 is shown in FIG. 15 of the drawings and is comprised by a read only memory look-up table 171. The look-up table 171 has stored in it the precalculated values of $\overline{V}$, $V_{2c}$ and $V_{2s}$ in digital data form for each X, Y address point on the target plane and functions in the same manner as a logarithm table. Thus, on receipt of an input x and y address signal from the controller or central processing unit, the ROM look-up table 171 will provide at its output terminal a signal $\overline{V}$, a signal $V_{2c}$ and a signal $V_{2s}$ all of which values have been precalculated pursuant to equations (1), (2), and (3), or pursuant to equations (5)–(7) to be described hereafter with relation to FIG. 16 for each X, Y, address point on the target plane. These values are in digital form and are supplied to respective digital to analog converter circuits 172, 173, and 174 that convert the signals to analog values for $\overline{V}$, $v_{2c}$, and $v_{2s}$. The octupole and quadrupole correction voltages are inverted in respective inverting amplifiers 175, 176, and 177 to derive the opposite-polarity correction voltage values $-\overline{v}$, $-v_{2c}$, and $-v_{2s}$ and the direct and inverted correction voltage values then supplied to a mixer 46. In mixer 46 the correction voltages are appropriately combined with the input analog deflection voltage values $v_x$, $-v_x$, $v_y$ and $-v_y$ derived from the output of the modified function generator 40 whose operation was described with relation to FIG. 11, and the signal values $av_y$, $-av_y$, $av_x$, $-av_x$ derived from an "a" ratio multiplier 45 described previously with relation to FIG. 1. Mixer 46 then operates in the manner described with relation to FIG. 6 to derive the combined deflection and correction voltages $v_1$–$v_8$ for application through deflection amplifiers to the deflector members of the eight-fold deflector structure as described previously.

While a preferred form of digital eight-fold deflector voltage generator has been illustrated in FIG. 15 wherein a ROM look-up table is employed, it is believed obvious to those skilled in the art that other forms of digital apparatus could be employed to derive the desired quadrupole-octupole correction voltages $\overline{V}$, $V_{2c}$, and $V_{2s}$. For example, in place of the ROM look-up table 171, a digital micro processor could be employed having a read only memory in which the values $A_{2c}$, $A_{2s}$, $A_4$, $V_c$ and $A_2$, have been prestored. The digital micro processor would then operate on each input x-y address signal pursuant to equations (1)–(3) or equations (5)–(7) to derive the desired output octupole and quadrupole correction signals $\overline{V}$, $V_{2c}$, and $V_{2s}$. Other variations and modifications will be suggested to those skilled in the art in light of these examples. Further, as will be obvious to those skilled in the art, either of the above digital methods of generating eight-fold deflector voltages can be employed with either single or double eight-fold deflectors, having either plate-centered or gap-centered symmetry.

Figure 16:
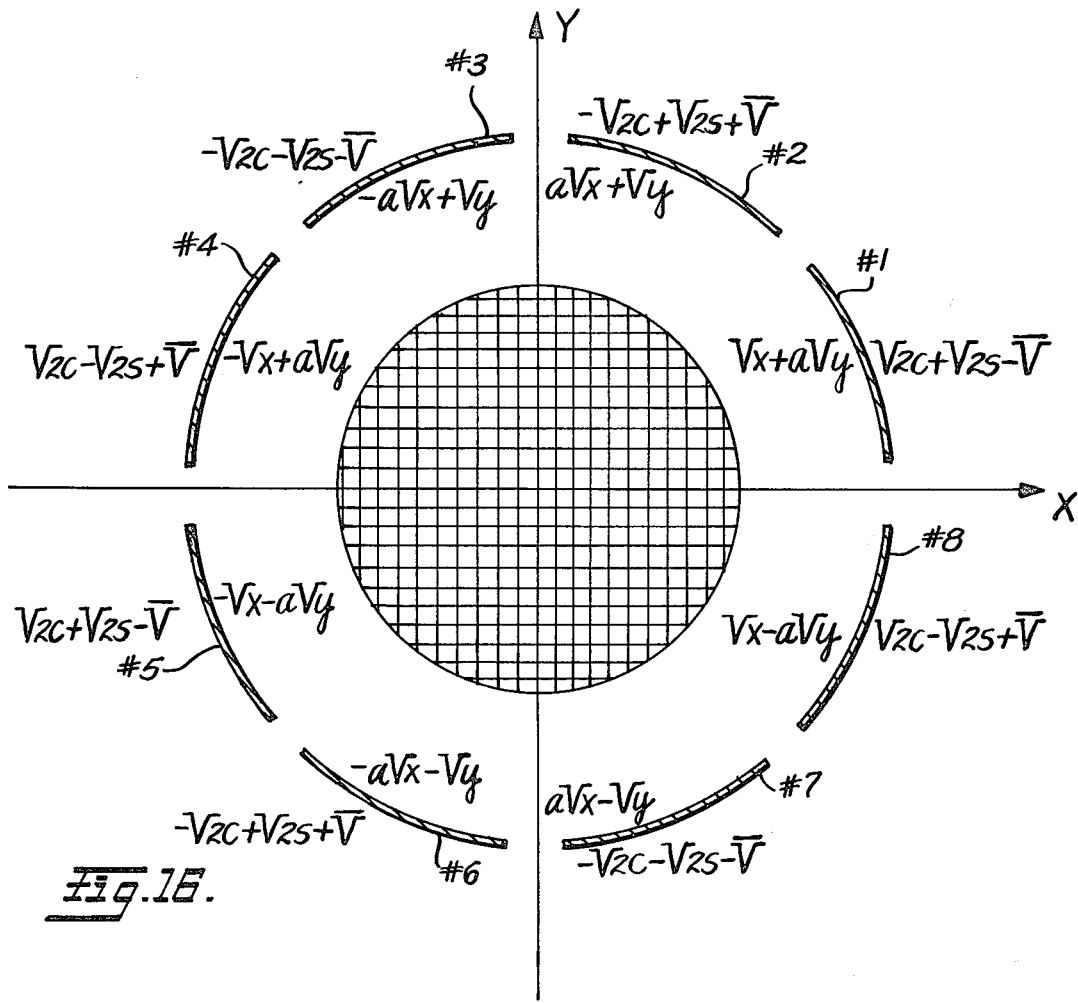
FIG. 16 is a cross sectional view of an alternative eight-fold deflector assembly suitable for use in practicing the invention, as seen looking from the gun toward the target.

FIG. 16 of the drawings illustrates the geometric configuration and arrangement of a gap-centered (GC) eight-fold deflector system which is an alternative method of employing the present invention particularly suited to the case of a deflector accessing a circular, or nearly circular, field. As shown in FIG. 16, the allowed correction consists of two quadrupole correction voltages $V_{2c}$ and $V_{2s}$, applied to adjacent pairs of deflector members, one displaced 45° from the other, plus an octupole correction voltage V. Again the deflection voltages have been shown on the inside of the deflector members, and the correction voltages depicted on the outside. With respect to the deflection voltages, the ratio "a" is substantially equal to $\sqrt{2}-1$. The quadrupole correction voltages $V_{2c}$ and $V_{2s}$ and the octupole correction $\overline{V}$ are given by the following expressions:

$$V_{2c} = [A_{2c}(V_x^2 - V_y^2)]/V_c \tag{5}$$

and $$V_{2s} = (2A_{2s} V_x V_y)/V_c \tag{6}$$

and $$\overline{V} = [A_4 V_x V_y (V_x^2 - V_y^2)]/V_c^3 \tag{7}$$

In the above equations $A_{2c}$, $A_{2s}$ and $A_4$ are constants which can be determined either empirically or by computer simulation and are dependent upon the physical parameters of the deflector structure as explained previously with the plate centered configuration. If the field accessed by the deflector is a circle, then from symmetry $a = \sqrt{2}-1$ and $A_{2c} = A_{2s}$. The development of the necessary deflection and correction potentials would require circuits similar to those described with relation to the species of FIG. 1, FIG. 3, or FIG. 5 of the drawings. A gap-centered (GC) eight-fold deflector assembly was built and tested which utilized the deflection and correction potentials depicted in FIG. 16, together with dynamic focusing, and the deflector aberration was reduced by a factor of 7 lower than that attainable with dynamic focusing alone. In the arrangement, the correction voltages typically were about 3% of the deflection voltages at the edge of the field produced by the deflector members.

From the foregoing description, it will be appreciated that the invention provides new and powerful methods and means for the dynamic correction and minimization of spot aberration produced at the target plane by the electron beam of electron beam tubes employing electrostatic deflection systems. This performance is achieved through the use of an eight-plate electrostatic deflector system while applying a general correction of two quadrupole and one octupole correction potentials used in conjunction with the normal deflection potentials. Further improvement may be achieved by the simultaneous use of a dynamic focusing potential applied to the objective lens of the electron beam tube.

It should also be obvious to those skilled in the art that the foregoing method and means for dynamic correction of electrostatic deflector systems applies not only to electron beam tubes but also to any charged particle beam device such as an ion beam tube.

Having described several embodiments of new methods and means for dynamic correction of electrostatic deflector systems for electron beam tubes constructed in accordance with the invention, it is believed obvious that other modifications and variations of the invention will be suggested to those skilled in the art in the light of the above teachings. It is therefore to be understood that changes may be made in the particular embodiments of the invention described which are within the full intended scope of the invention as defined by the appended claims.

What is claimed is:

1. An electron beam tube electrostatic deflection system comprising an evacuated housing, electron gun means disposed at one end of the evacuated housing for producing a beam of electrons, lens means secured within the evacuated housing intermediate the electron gun means and the opposite end of the housing and disposed along the path of the beam of electrons for focusing and centering the beam of electrons into a finely focused pencil-like beam of electrons, eight-fold deflector means secured within the housing and disposed about the path of the finely focused beam of electrons, said eight-fold deflector means comprising eight electrically conductive spaced-apart members which are electrically isolated one from the other and annularly arranged around the center electron beam path, means for applying deflection electric potentials to the respective members of the eight-fold deflector means for electrostatically deflecting the finely focused electron beam to a desired point on a target plane located at an opposite end of the evacuated housing from the electron gun means, and means for applying correction electric potentials to the respective members of the eight-fold deflector means in conjunction with the deflection electric potentials to minimize electron beam spot aberration at the target plane, said means for applying correction electric potentials to the respective members of the eight-fold deflector means comprising means for applying two different quadrupole correction electric potentials to selected ones of the eight-fold deflector members and means for applying an octupole correction electric potential to all eight deflector members.

2. An electron beam tube electrostatic deflection system according to claim 1 wherein the eight-fold deflector members are plate centered with respect to the x and y axes of the projected target plane and the eight-fold deflector members are disposed such that a first deflector member is centered on the x axis and is identified as number 1, and the remaining 7 eight-fold deflector members are evenly annularly spaced about the center beam axis defined by the intersection of the x and y axes and are consecutively numbered 2 through 8 in a counterclockwise direction from the number 1 deflector as viewed in cross section looking toward the target plane; the deflection electric potentials applied to the respective eight-fold deflector members 1–8 starting from number 1 deflector member are respectively given by the values $V_x$, $a(V_x + V_y)$, $V_y$, $-a(V_x - V_y)$, $-V_x$, $-A(V_x + V_y)$, $-V_y$ and $a(V_x - V_y)$ where a is a constant substantially equal to $\sqrt{2}/2$, $V_x$ is the analog deflection voltage value corresponding to a desired x axis address point on the target plane and $V_y$ is the analog deflection voltage value corresponding to a desired y axis address point on the target plane; and the quadrupole and octupole correction electric potentials applied to one set of four eight-fold deflector members comprised by deflector members 1, 3, 5 and 7 are given respectively by the values $(V_{2c} - \bar{V})$, $(-V_{2c} - \bar{V})$, $(V_{2c} - \bar{V})$ and $-V_{2c} - \bar{V})$ and the quadrupole and octupole correction potentials applied to the remaining number of 2, 4, 6 and 8 eight-fold deflector members are given respectively by the values $(V_{2s} + \bar{V})$, $(-V_{2s} + \bar{V})$, $(V_{2s} + \bar{V})$ and $(-V_{2s} + \bar{V})$ where the quadrupole correction electric potentials $V_{2c}$ and $V_{2s}$ applied to the said respective sets of four eight-fold deflector members are given by the expression $$V_{2c} = [A_{2c}(V_x^2 - V_y^2)]/V_c$$

and $$V_{2s} = (2A_{2s} V_x V_y)/V_c$$

and the octupole correction voltage $\bar{V}$ applied to all 8 eight-fold deflector members is given by the expression $$\bar{V} = [A_4(V_x^4 - 6V_x^2 V_y^2 + V_y^4)]/4V_c^3$$

where $A_{2c}$, $A_{2s}$ and $A_4$ are constants and $-V_c$ is the cathode voltage of the electron gun means measured with respect to the voltage of the deflector means when $V_x = V_y = 0$.

3. An electron beam tube electrostatic deflection system according to claim 1 further including means for applying a dynamic focusing electric potential to the lens means in conjunction with the deflection and correction electric potentials being applied to the eight-fold deflector means.

4. An electron beam electrostatic deflection system according to claim 2 further including means for applying a dynamic focusing electric potential to the lens means in conjunction with the deflection and correction electric potentials applied to the eight-fold deflector means, the dynamic focusing electric potential being given by the value $$V_{OBJ(c)} = V_{OBJ(0)} + A_{DF}(V_x^2 + V_y^2)/V_c$$

where $A_{DF}$ is a constant and $V_{OBJ(0)}$ is the uncorrected value of the direct current objective lens supply voltage.

5. An electron beam tube electrostatic deflection system according to claim 2 wherein said means for applying deflection electric potentials and said means for applying correction electric potentials to the respective eight-fold deflector members are comprised by eight-fold deflection-correction voltage generator means for generating both the deflection potentials and correction potentials simultaneously and applying the combined deflection and correction potentials to the respective eight-fold deflector members.

6. An electron beam tube electrostatic deflection system according to claim 5 wherein said eight-fold deflector voltage generator means is comprised by respective x and y function generator means for converting the respective x axis and y axis electric address signals to corresponding analog voltages having the values $v_x$, $-v_x$, $v_y$, and $-v_y$, quadrupole-octupole correction voltage generator means responsive at least indirectly to the input x and y axis address signals for deriving the output potentials $\bar{v}$, $-\bar{v}$, $v_{2c}$, $-v_{2c}$, $v_{2s}$ and $-v_{2s}$, "a" ratio multiplier means responsive to the outputs from said x and y functions generator means for deriving the potentials $av_y$, $-av_y$, $av_x$, and $-av_x$, and mixer means comprising a plurality of interconnected summing amplifiers responsive to the outputs from said x and y function generator means, said quadrupole-octupole correction voltage generator means, and said "a" ratio multiplier means for combining and deriving eight different combined deflection and correction electric potentials $v_1$-$v_8$ for application to the respective eight-fold deflector members 1-8 wherein $$v_1 = v_x + v_{2c} - \bar{v},$$

$$v_2 = av_x + av_y + v_{2s} + \bar{v},$$

$$v_3 = v_y - v_{2c} - \bar{v},$$

$$v_4 = -av_x + av_y - v_{2s} + \bar{v},$$

$$v_5 = -v_x + v_{2c} - \bar{v},$$

$$v_6 = -av_x - av_y + v_{2s} + \bar{v},$$

$$v_7 = -v_y - v_{2c} - \bar{v}$$

and $$v_8 = av_x - av_y - v_{2s} + \bar{v}$$

where "a" is a constant.

7. An electron beam tube electrostatic deflection system according to claim 6 wherein the voltages applied to the respective eight-fold deflector members 1-8; namely, $$V_1 = V_x + V_{2c} - \bar{V},$$

$$V_2 = a(V_x + V_y) + V_{2s} + \bar{V},$$

$$V_3 = V_y - V_{2c} - \bar{V},$$

$$V_4 = -a(V_x - V_y) - V_{2s} + \bar{V},$$

$$V_5 = -V_x + V_{2c} - \bar{V},$$

$$V_6 = -a(V_x + V_y) + V_{2s} + \bar{V},$$

$$V_7 = V_y - V_{2c} - \bar{V},$$

and $$V_8 = a(V_x - V_y) - V_{2s} + \bar{V},$$

are derived from the voltages $v_1$-$v_8$, respectively, by suitable amplification.

8. An electron beam tube electrostatic deflection system according to claim 7 wherein said quadrupole-octupole correction voltage generator means comprise first multiplier circuit means responsive to the output from the x function generator means for deriving a signal $v_x^2$, second multiplier circuit means responsive to the output from the y function generator means for deriving a signal $v_y^2$, first and second summing circuit means both responsive to said $v_x^2$ signal, first and second operational amplifier means having the transfer functions $-(3 + 2\sqrt{2})$ and $-(3 - 2\sqrt{2})$, respectively, connected intermediate the output of second multiplier circuit means and respective second summing input terminals of said first and second summing circuit means respectively for deriving two separate signals having the values $-(3 + 2\sqrt{2}) v_y^2$ and $-(3 - 2\sqrt{2}) v_y^2$ respectively, and supplying the same to the respective first and second summing circuit means, said first and second summing circuit means serving to sum together the $v_x^2$ signals with the signals from the respective first and second operational amplifier means to derive two separate signals having the values $v_x^2 - (3 + 2\sqrt{2}) v_y^2$ and $v_x^2 - (3 - 2\sqrt{2}) v_y^2$, respectively, third multiplier circuit means responsive to the outputs from the first and second summing circuit means for multiplying together the two outputs thereof and third operational amplifier means responsive to the product from the third multiplier circuit means and having the transfer function $\frac{1}{4} C_1^3 A_4$ for deriving the octupole correction potential $$\bar{v} = \frac{1}{4} C_1^3 A_4 (v_x^4 - 6v_x^2 v_y^2 + v_y^4)$$

where $A_4$ and $C_1$ are constants.

9. An electron beam tube electrostatic deflection system according to claim 8 wherein said quadrupole-octupole correction voltage generator means further includes fourth multiplier circuit means responsive to the outputs of said x and y function generator means for deriving a signal $v_x v_y$, third summing amplifier means having a first summing input terminal connected to the $v_x^2$ output of the first multiplier circuit means, inverter amplifier means connected between the $v_y^2$ output of the second multiplier means and the second summing input terminal of the third summing circuit means for supplying a signal $-v_y^2$ thereto, said third summing amplifier means serving to derive a signal $v_x^2 - v_y^2$, fourth operational amplifier means having a transfer function $C_1 A_{2c}$ and responsive to the $v_x^2 - v_y^2$ signal from the third summing amplifier means for deriving the quardupole correction potential $v_{2c} = C_1 A_{2c}(v_x^2 - v_y^2)$, fifth operational amplifier means having the transfer function $2C_1 A_{2s}$ and responsive to the $v_x v_y$ signal from said fourth multiplier circuit means for deriving the quadrupole correction potential $v_{2s} = 2C_1 A_{2s} v_x v_y$ where $C_1$, $A_{2c}$ and $A_{2s}$ are constants, and second, third and fourth inverter amplifier means connected respectively to the outputs from the third, fourth and fifth operational amplifier means for deriving the $-\bar{v}$ octupole correction potential, the $-v_{2c}$ quadrupole correction potential and the $-v_{2s}$ quadrupole correction potential, respectively.

10. An electron beam tube electrostatic deflection system according to claim 9 further including means for applying a dynamic focusing potential to the lens means in conjunction with the deflection and correction electric potentials applied to the eight-fold deflector means, the dynamic focusing electric potential being given by the value $$V_{OBJ(c)} = V_{OBJ(0)} + A_{DF}(V_x^2 + V_y^2)/V_c$$

where $A_{DF}$ is a constant and $V_{OBJ(0)}$ is the uncorrected value of the direct current objective lens supply voltage.

11. An electron beam tube electrostatic deflection system according to claim 1 wherein said lens means is comprised by condenser lens means maintained at the same potential as the cathode of the electron gun means and an objective lens means excited by the dynamic focusing potential supplied from said dynamic focus generator means, said condenser lens means being disposed intermediate the objective lens means and the electron gun means.

12. An electron beam tube electrostatic deflection system according to claim 9 wherein said eight-fold deflector means comprises coarse deflector means for a compound fly's-eye type electron beam tube having both an eight-fold coarse deflector system and a fine deflector system disposed between the target plane and the eight-fold coarse deflector system within the evacuated housing, and wherein the lens means comprises a collimating lens assembly disposed intermediate the electron gun means and the eight-fold coarse deflector system and the lens means further includes fly's-eye type objective lens means interposed between the eight-fold coarse deflector system and the target.

13. An electron beam tube electrostatic deflection system according to claim 12 wherein the eight-fold coarse deflector system is comprised by two eight-fold deflector sections with each eight-fold deflector section comprised of eight elemental deflector members annularly arrayed around the center electron beam path and with the elemental deflector members of the first section interconnected electrically with the 180° opposed deflector members of the second section whereby the $V_1$ combined deflection and correction potential is applied to the number 1 eight-fold deflector member of the first section and the number 5 deflector of the second section and the $V_2$, $V_3$, $V_4$, $V_5$, $V_6$, $V_7$ and $V_8$ deflection and correction potential are applied to the respective number 2–8 deflector members of the first section and the number 6, 7, 8, 1, 2, 3 and 4 deflector members of the second section, respectively.

14. An electron beam tube electrostatic deflection system according to claim 1 further including nonlinear, field distortion correction voltage generator means included in said eight-fold deflector voltage generator means for linearizing the actual x and y axis deflection of the electron beam to cause the deflection to be linearly proportional to the x and y addresses.

15. An electron beam tube electrostatic deflection system according to claim 13 further including nonlinear, field distortion correction voltage generator means included in said eight-fold deflector voltage generator means for linearizing the actual x and y axis deflection of the electron beam to cause the deflection to be linearly proportional to the x and y addresses.

16. An electron beam tube electrostatic deflection system according to claim 15 wherein the fine deflection system of the electron beam tube is comprised by a planar array of a multiplicity of fine four-fold deflection assemblies with each four-fold deflection assembly being comprised by four separate, electrically isolated deflector members disposed on four opposed sides of a central electron path through each fine four-fold deflector assembly and the system further includes fine four-fold deflection generator means comprising respective x and y function generator means responsive to input fine x, y addresses from a controller for deriving respective output voltages $v_{FX}$, $v_{FY}$, $-v_{FX}$, $-v_{FY}$ for application, following amplification by amplifier means, to the respective deflector members of the respective fine four-fold deflector assemblies in response to the input fine x, y addresses supplied from the controller.

17. An electron beam tube electrostatic deflection system according to claim 1 wherein said eight-fold deflector means comprises coarse deflector means for a compound fly's-eye type electron beam tube having both an eight-fold coarse deflector system and a fine deflector system disposed between the target plane and the eight-fold coarse deflector system within the evacuated housing, and wherein the lens means comprises a collimating lens assembly disposed intermediate the electron gun means and the eight-fold coarse deflector system and the lens means further includes a fly's-eye type objective lens means interposed between the eight-fold coarse deflector system and the target.

18. An electron beam tube electrostatic deflection system according to claim 17 wherein the eight-fold coarse deflector system is comprised by two eight-fold deflector sections with each eight-fold deflector section comprised of eight elemental deflector members annularly arrayed around the center electron beam path and with the elemental deflector members of the first section interconnected electrically with the 180° opposed deflector members of the second section whereby the $V_1$ combined deflection and correction potential is applied to the number 1 eight-fold deflector member of the first section and the number 5 deflector of the second section and the $V_2$, $V_3$, $V_4$, $V_5$, $V_6$, $V_7$ and $V_8$ deflection and correction potential are applied to the respective number 2–8 deflector members of the first section and the number 6, 7, 8, 1, 2, 3 and 4 deflector members of the second section, respectively.

19. An electron beam tube electrostatic deflection system according to claim 18 further including "b" factor multiplying means interposed in the interconnection to the second section of the eight-fold coarse deflector means for multiplying the voltages applied to the second section eight-fold deflector members by an adjustable factor "b" prior to application to the second section deflector members for fine tuning the eight-fold coarse deflector system.

20. An electron beam tube electrostatic deflection system according to claim 19 further including nonlinear, field distortion correction voltage generator means included in said eight-fold deflector voltage generator means for linearizing the actual x and y axis deflection of the electron beam to cause the deflection to be linearly proportional to the x and y addresses.

21. An electron beam tube electrostatic deflection system according to claim 20 wherein the fine deflection system of the electron beam tube is comprised by a planar array of a multiplicity of fine four-fold deflection assemblies with each four-fold deflection assembly being comprised by four separate, electrically isolated deflector members disposed on four opposed sides of a central electron path through each fine four-fold deflector assembly and the system further includes fine four-fold deflection generator means comprising respective x and y function generator means responsive to input fine x, y addresses from a controller for deriving respective output voltages $v_{FX}$, $v_{FY}$, $-v_{FX}$, $-v_{FY}$ for application, following amplification by amplifier means, to the respective deflector members of the respective fine four-fold deflector assemblies in response to the input fine x, y addresses supplied from the controller.

22. An electron beam tube electrostatic deflection system according to claim 18 further including nonlinear, field distortion correction voltage generator means included in said eight-fold deflector voltage generator means for linearizing the actual x and y axis deflection of the electron beam to cause the deflection to be linearly proportional to the x and y addresses.

23. An electron beam tube electrostatic deflection system according to claim 22 wherein the fine deflection system of the electron beam tube is comprised by a planar array of a multiplicity of fine four-fold deflection assemblies with each four-fold deflection assembly being comprised by four separate, electrically isolated deflector members disposed on four opposed sides of a central electron path through each fine four-fold deflector assembly and the system further includes fine four-fold deflection generator means comprising respective x and y function generator means responsive to input fine x, y addresses from a controller for deriving respective output voltages $v_{FX}$, $v_{FY}$, $-v_{FX}$, $-v_{FY}$ for application, following amplification by amplifier means, to the respective deflector members of the respective fine four-fold deflector assemblies in response to the input fine x, y addresses supplied from the controller.

24. An electron beam tube electrostatic deflection system according to claim 7 wherein said quadrupole-octupole correction voltage generator means is digitally operated and has the input digitally coded x axis and y axis address signals supplied thereto directly for digitally deriving the v, $-v$, $v_{2c}$, $-v_{2c}$, $v_{2s}$, and $-v_{2s}$ signals.

25. An electron beam tube electrostatic deflection system according to claim 24 wherein said digitally operated quadrupole-octupole correction voltage generator means comprises a read only memory look-up table having stored therein precalculated values of $\overline{v}$, $v_{2c}$, and $v_{2s}$ for each input x-y axes address location.

26. An electron beam tube electrostatic deflection system according to claim 1 wherein the eight-fold deflector members are gap-centered with respect to the x and y axes of the projected target plane and are disposed such that the gap between the eighth and the first deflector members is centered on the x axis with the first deflector member being located in the first quadrant and identified as number 1 and the remaining 7 eight-fold deflector members are evenly annularly spaced about the electron beam axis defined by the intersection of the x and y axes and are consecutively numbered 2 through 8 in a counterclockwise direction from the number 1 deflector as viewed in cross section looking toward the target plane from the number 1 deflector and the deflection electric potentials applied to the respective eight-fold deflector members 1-8 starting from number 1 deflector are given respectively by the values $(V_x + aV_y)$, $(aV_x + V_y)$, $(-aV_x + V_y)$, $(-V_x + aV_y)$, $(-V_x - aV_y)$, $(-aV_x - V_y)$, $(aV_x - V_y)$ and $(V_x - aV_y)$ where the constant "a" is substantially equal to $\sqrt{2}-1$, $V_x$ is the analog deflection voltage value corresponding to a desired x axis address point on the target plane and $V_y$ is the analog deflection voltage value corresponding to a desired y axis address point on the target plane; the quadrupole and octupole correction electric potentials applied to the eight-fold deflector members are respectively the values $(V_{2c} + V_{2s} - \overline{V})$, $(-V_{2c} + V_{2s} + \overline{V})$, $(-V_{2c} - V_{2s} - \overline{V})$, $(V_{2c} - V_{2s} + \overline{V})$, $(V_{2c} + V_{2s} - \overline{V})$, $(-V_{2c} + V_{2s} + \overline{V})$, $(-V_{2c} - V_{2s} - \overline{V})$ and $(V_{2c} - V_{2s} + \overline{V})$ where $V_{2c}$ is one of the quadrupole correction voltages and is given by the value $$V_{2c} = A_{2c}[(V_x^2 - V_y^2)/V_c]$$

and $V_{2s}$ is the other quadrupole correction voltage and is given by the value $$V_{2s} = (2A_{2s} V_x V_y)/V_c$$

and $\overline{V}$ is the octupole correction electric potential applied to all of the eight-fold deflector members and is given by the expression $$\overline{V} = A_4 V_x V_y [(V_x^2 - V_y^2)/V_c^3]$$

and $A_{2c}$, $A_{2s}$ and $A_4$ are constants and $-V_c$ is the cathode voltage of the electron gun means.

27. An electron beam tube electrostatic deflection system according to claim 26 wherein said means for applying deflection electric potentials and said means for applying correction electric potentials to the respective eight-fold deflector members are comprised by eight-fold deflection-correction voltage generator means for generating both the deflection potentials and correction potentials simultaneously and applying the combined deflection and correction potentials to the respective eight-fold deflector members, said eight-fold deflector voltage generator means is comprised by respective x and y function generator means for converting the respective x axis and y axis electric address signals to corresponding analog voltages having the values $v_x$, $-v_x$, $v_y$, and $-v_y$, quadrupole-octupole correction voltage generator means responsive at least indirectly to the input x and y axis address signals for deriving the output potentials $\overline{v}$, $-\overline{v}$, $v_{2c}$, $-v_{2c}$, $v_{2s}$ and $-v_{2s}$, "a" ratio multiplier means responsive to the outputs from said x and y functions generator means for deriving the potentials $av_y$, $-av_y$, $av_x$, and $-av_x$, and mixer means comprising a plurality of interconnected summing amplifiers responsive to the outputs from said x and y function generator means, said quadrupole-octupole correction voltage generator means, and said "a" ratio multiplier means for combining and deriving eight different combined deflection and correction electric potentials $V_1$-$V_8$ for application to the respective eight-fold deflector members 1-8 wherein $v_1 = v_x + av_y + v_{2c} + v_{2s} - \overline{v}$, $v_2 = av_x + v_y - v_{2c} + v_{2s} + \overline{v}$, $v_3 = -av_x + v_y - v_{2s} - \overline{v}$, $v_4 = -v_x + av_y + v_{2c} - v_{2s} + \overline{v}$, $v_5 = -v_x - av_y + v_{2c} + v_{2s} - \overline{v}$, $v_6 = -av_x - v_y - v_{2c} + v_{2s} + \overline{v}$, $v_7 = av_x - v_y - v_{2c} - v_{2s} - \overline{v}$, and $v_8 = v_x - av_y + v_{2c} - v_{2s} + \overline{v}$, where "a" is a constant.

28. An electron beam tube electrostatic deflection system according to claim 27 wherein the voltages applied to the respective eight-fold deflector members 1-8; namely, $V_1 = V_x + aV_y + V_{2c} + V_{2s} - \overline{V}$, $V_2 = aV_x + V_y - V_{2c} + V_{2s} + \overline{V}$, $V_3 = -aV_x + V_y - V_{2c} - V_{2s} - \overline{V}$, $V_4 = -V_x + aV_y + V_{2c} - V_{2s} + \overline{V}$, $V_5 = -V_x - aV_y + V_{2c} + V_{2s} - \overline{V}$, $V_6 = -aV_x - V_y - V_{2c} + V_{2s} + \overline{V}$, $V_7 = aV_x - V_y - V_{2c} - V_{2s} - \overline{V}$, and $V_8 = V_x - aV_y + V_{2c} - V_{2s} + \overline{V}$, are derived from the voltages $v_1$ - $v_8$, respectively, by suitable amplification.

29. An electron beam tube electrostatic deflection system according to claim 28 wherein said quadrupole-octupole correction voltage generator means is digitally operated and has the input digitally coded x axis and y axis address signals supplied thereto directly for digitally deriving the $\overline{v}$, $-\overline{v}$, $v_{2c}$, $-v_{2c}$, $v_{2s}$ and $-v_{2s}$ signals.

30. An electron beam tube electrostatic deflection system according to claim 29 wherein said digitally operated quadrupole-octupole correction voltage generator means comprises a read only memory look-up table having stored therein precalculated values of $\overline{v}$, $v_{2c}$ and $v_{2s}$ for each input x-y axes address location.

31. A method of correcting for electron beam aberrations in an electron beam tube electrostatic deflection system which comprises an evacuated housing, electron gun means disposed at one end of the evacuated housing for producing a beam of electrons, lens means secured within the evacuated housing intermediate the electron gun means and the opposite end of the housing and disposed along the path of the beam of electrons for focusing and centering the beam of electrons into a finely focused pencil-like beam of electrons, eight-fold deflector means secured within the housing and disposed about the path of the finely focused beam of electrons, said eight-fold deflector means comprising eight electrically conductive spaced-apart members which are electrically isolated one from the other and annularly arranged around the center electron beam path, means for applying deflection electric potentials to the respective members of the eight-fold deflector means for electrostatically deflecting the finely focused electron beam to a desired point on a target plane located at an opposite end of the evacuated housing from the electron gun means, and means for applying correction electric potentials to the respective members of the eight-fold deflector means in conjunction with the deflection electric potentials to minimize electron beam spot aberration at the target plane; said method of correcting for electron beam aberration otherwise produced during electrostatic deflection of the electron beam comprising applying two different quadrupole correction electric potentials to selected ones of the eight-fold deflector members and applying an octupole correction electric potential to all eight-fold deflector members.

32. The method of correcting for aberrations in an electron beam tube electrostatic deflection system according to claim 31 wherein the eight-fold deflector members are plate-centered with respect to the x and y axes of the projected target plane and the eight-fold deflector members are disposed such that a first deflector member is centered on the x axis and the remaining seven eight-fold deflector members are evenly annularly spaced about the center electron beam axis defined by the intersection of the x and y axes; the deflection electric potentials applied to the respective eight-fold deflector members starting from the first deflector member are respectively given by the values $V_x$, $a(V_x + V_y)$, $V_y$, $-a(V_x - V_y)$, $-V_x$, $-a(V_x + V_y)$, $-V_y$ and $a(V_x - V_y)$ where $a$ is substantially equal to $\sqrt{2}/2$, $V_x$ is the analog deflection voltage value corresponding to a desired x axis address point on the target plane and $V_y$ is the analog deflection voltage value corresponding to a desired y axis address point on the target plane; and the quadrupole and octupole correction electric potentials applied to one set of four eight-fold deflector members are given respectively by the values $(V_{2c} - \overline{V})$, $(-V_{2c} - \overline{V})$, $(V_{2c} - \overline{V})$ and $(-V_{2c} - \overline{V})$ and the quadrupole and octupole correction potentials applied to the remaining eight-fold deflector members are given respectively by the values $(V_{2s} + \overline{V})$, $(-V_{2s} + \overline{V})$, $(V_{2s} + \overline{V})$ and $(-V_{2s} + \overline{V})$ where the quadrupole correction electric potentials $V_{2c}$ and $V_{2s}$ applied to the said respective sets of 4 eight-fold deflector members are given by the expression $$V_{2c} = [A_{2c}(V_x^2 - V_y^2)]/V_c$$

and $$V_{2s} = (2A_{2s}V_xV_y)/V_c$$

and the octupole correction voltage $\overline{V}$ is given by the expression $$\overline{V} = [A_4(V_x^4 - 6V_x^2 V_y^2 + V_y^4)]/4V_c^3$$

where $A_{2c}$, $A_{2s}$ and $A_4$ are constants and $-V_c$ is the cathode voltage of the electron gun means.

33. The method of correcting for aberrations in an electron beam tube electrostatic deflection system according to claim 31 further including applying a dynamic focusing electric potential to the lens means in conjunction with the deflection and correction electric potentials applied to the eight-fold deflector means, the dynamic focusing electric potential being given by the value $$V_{OBJ(c)} = V_{OBJ(O)} + A_{DF}(V_x^2 + V_y^2)/V_c$$

where $A_{DF}$ is a constant and $V_{OBJ(O)}$ is the uncorrected value of the direct current objective lens supply voltage.

34. The method of correcting for aberrations in an electron beam tube electrostatic deflection system according to claim 31 wherein both the deflection potentials and correction potentials are generated simultaneously and combined for simultaneously applying the combined deflection and correction potentials to the respective eight-fold deflector members and wherein the respective x axis and y axis electric address signals are converted to corresponding analog voltages having the values $v_x$, $-v_x$ and $v_y$, $-v_y$, the analog voltages $v_x$ and $v_y$ are multiplied and processed pursuant to suitable transfer functions to derive the octupole and quadrupole correction potentials $\overline{v}$, $-\overline{v}$, $-v_{2c}$, $v_{2s}$ and $-v_{2s}$, the analog voltages $v_x$, $-v_x$, $v_y$ and $-v_y$ are multiplied by suitable ratios "a" to derive the potentials $av_y$, $-av_y$, $av_x$ and $-av_x$, and the potentials thus obtained suitably combined to derive eight different combined deflection and correction electric potentials $v_1$-$v_8$ for application to the respective eight-fold deflector members wherein $$v_1 = v_x + v_{2c} - \overline{v}$$
$$v_2 = av_x + av_y + v_{2s} + \overline{v}$$
$$v_3 = v_y - v_{2c} - \overline{v}$$
$$v_4 = -av_x - av_y - v_{2s} + \overline{v}$$
$$v_5 = -v_x + v_{2c} - \overline{v}$$
$$v_6 = -av_x - av_y + v_{2s} + \overline{v}$$
$$v_7 = -v_y - v_{2c} - \overline{v} \text{ and}$$
$$v_8 = av_x - av_y - v_{2s} + \overline{v}$$

35. The method of correcting for aberrations in an electron beam tube electrostatic deflection system according to claim 34 wherein the octupole correction potential v is produced by multiplying the $v_x$ deflection signal by itself to derive a signal $v_x^2$, multiplying the $v_y$ deflection signal by itself to derive a signal $v_y^2$, separately multiplying the $v_y^2$ signal by factors $-(3 + \sqrt{2})$ and $-(3 - 2\sqrt{2})$ in two separate operations to derive in two separate signals $-(3 + \sqrt{2}) v_y^2$ and $-(3 - 2\sqrt{2}) v_y^2$, summing each of the last mentioned signals together with the signal $v_x^2$ to derive two signals $v_x^2 - (3 + 2\sqrt{2}) v_y^2$ and $v_x^2 - (3 - 2\sqrt{2}) v_y^2$, multiplying the last two mentioned signals together and thereafter multiplying their product times the factor $\frac{1}{4} C_1^3 A_4$ to derive the octupole correction voltage $$\overline{v} = \tfrac{1}{4} C_1^3 A_4 (v_x^4 - 6v_x^2 v_y^2 + v_y^4)$$

where $A_4$ and $C_1$ are constants.

36. The method of correcting for aberrations in an electron beam tube according to claim 35 further including the steps of multiplying the $v_x$ and $v_y$ deflection signals by each other to derive a signal $v_x v_y$, multiplying the $v_x v_y$ signal by a factor $2C_1 A_{2s}$ to derive the quadrupole correction potential $$v_{2s} = 2C_1 A_{2s} v_x v_y$$

where $A_{2s}$ is a constant, inverting the $v_y^2$ signal to derive a signal $-v_y^2$, summing the signals $v_x^2$ and $-v_y^2$ to derive a signal $v_x^2 - v_y^2$, and multiplying the $v_x^2 - v_y^2$ signal by a factor $C_1 A_{2c}$ to derive the quadrupole correction potentials $$v_{2c} = C_1 A_{2c} (v_x^2 - v_y^2)$$

where $A_{2c}$ is a constant, and inverting the respective $\overline{v}$, $v_{2s}$ and $v_{2c}$ potentials to derive the octupole and quadrupole correction potentials $-\overline{v}$, $-v_{2s}$ and $-v_{2c}$.

37. The method of correcting for aberrations in an electron beam tube electrostatic deflection system according to claim 31 wherein the eight-fold deflector members are gap-centered with respect to the x and y axes of the projected target plane and are disposed such that the gap between the eighth and the first deflector members is centered on the x axis and the first deflector member being located in the first quadrant and the remaining seven eight-fold deflector members are evenly annularly spaced about the electron beam axis and defined by the intersection of the x and y axes; the deflection electric potentials applied to the respective eight-fold deflector members starting from the first deflector are given respectively by the values $(V_x + aV_y)$, $(aV_x + V_y)$, $(-aV_x + V_y)$, $(-V_x + aV_y)$, $(-V_x - aV_y)$, $(-aV_x - V_y)$ and $(aV_x - aV_y)$ where a is substantially equal to $\sqrt{2}-1$, $V_x$ is the analog deflection voltage value corresponding to a desired x axis address point on the target plane and $V_y$ is the analog deflection voltage value corresponding to a desired y axis address point on the target plane; the quadrupole and octupole correction electric potentials applied to the eightfold deflector members are respectively the values $(V_{2c} + V_{2s} - \overline{V})$, $(-V_{2c} + V_{2s} + \overline{V})$, $(-V_{2c} - V_{2s} - \overline{V})$, $(V_{2c} - V_{2s} + \overline{V})$, $(V_{2c} + V_{2s} - \overline{V})$, $(-V_{2c} + V_{2s} + \overline{V})$, $(-V_{2c} - V_{2s} - \overline{V})$ and $(V_{2c} - V_{2s} + \overline{V})$ where $V_{2c}$ is one of the quadrupole correction voltages and is given by the value $$V_{2c} = A_{2c} [(V_x^2 - V_y^2)/V_c]$$

and $V_{2s}$ is the other quadrupole correction voltage and is given by the value $$V_{2s} = (2A_{2s} V_x V_y)/V_c$$

and $\overline{V}$ is the octupole correction electric potential applied to all of the eight-fold deflector members and is given by the expression $$\overline{V} = A_4 V_x V_y [(V_x^2 - V_y^2)/V_c^3]$$

and $A_{2c}$, $A_{2s}$ and $A_4$ are constants and $-V_c$ is the cathode voltage of the electron gun means.

38. The method of correcting for aberrations in an electron beam tube electrostatic deflection system according to claim 37 further including applying a dynamic focusing electric potential to the lens means in conjunction with the deflection and correction electric potentials being applied to the eight-fold deflector means.

39. An octupole correction potential signal generator for an electron beam tube electrostatic deflection system comprising first multiplier circuit means responsive to a deflection voltage signal $v_x$ for multiplying the $v_x$ signal by itself to derive a signal $v_x^2$, second multiplier circuit means responsive to a deflection voltage signal $v_y$ for multiplying the $v_y$ signal by itself to derive a signal $v_y^2$, first and second summing amplifier means both responsive to said $v_x^2$ signal, first and second operational amplifier means having the transfer functions $-(3 + 2\sqrt{2})$ and $-(3 - 2\sqrt{2})$ respectively connected intermediate the output of the second multiplier circuit means and the second summing input terminals of said first and second summing circuit means respectively for deriving two separate signals having the values $-(3 + 2\sqrt{2}) v_y^2$ and $-(3 - 2\sqrt{2}) v_y^2$ respectively and supplying the same to the respective first and second summing circuit means, said first and second summing circuit means serving to sum together the $v_x^2$ signals with the signals from the respective first and second operational amplifier means to derive two separate signals having the values $$v_x^2 - (3 + 2\sqrt{2}) v_y^2 \text{ and } v_x^2 - (3 - 2\sqrt{2}) v_y^2,$$

third multiplier circuit means responsive to the outputs from the first and second summing circuit means for multiplying together the two outputs thereof and third operational amplifier means responsive to the product from the third multiplier circuit means and having the transfer function $\frac{1}{4} C_1^3 A_4$ for deriving the octupole correction potential $$\overline{v} = \tfrac{1}{4} C_1^3 A_4 (v_x^4 - 6v_x^2 v_y^2 + v_y^4)$$

where $C_1 = G/V_c =$ gain G of deflection amplifiers divided by the negative of the cathode voltage $V_c$ of the electron gun of the electron beam tube and $A_4$ is a constant.

40. A combined quadrupole-octupole correction potential signal generator for an electron beam tube electrostatic deflection system according to claim 39 further including fourth multiplier circuit means responsive to the $v_x$ and $v_y$ deflection signal potentials for deriving a signal $v_x v_y$, third summing amplifier means having a first summing input terminal connected to the $v_x^2$ output of the first multiplier circuit means, inverter amplifier means connected between the $v_y^2$ output of the second multiplier circuit means and the second summing input terminal of the third summing circuit means for supplying a signal $-v_y^2$ thereto, said third summing amplifier means serving to derive a signal $v_x^2 - v_y^2$, fourth operational amplifier means having a transfer function $C_1 A_{2c}$ and responsive to the $v_x^2 - v_y^2$ signal for deriving the quadrupole correction potential $$v_{2c} = C_1 A_{2c} (v_x^2 - v_y^2),$$

fifth operational amplifier means having the transfer function $2C_1 A_{2s}$ and responsive to the $v_x v_y$ signal from said fourth multiplier circuit means for deriving the quadrupole correction potential $$v_{2s} = 2C_1 A_{2s} V_x V_y.$$

41. An quadrupole-octupole generator according to claim 40 further including second, third and fourth inverter amplifier means connected respectively to the outputs from the third, fourth and fifth operational amplifier means for deriving the $-v$ octupole corrected potential, the $-v_{2c}$ quadrupole correction potential and the $-v_{2s}$ quadrupole correction potential, respectively.

42. An electron beam tube electrostatic deflection system comprising an eight-fold deflector assembly for securement within an evacuated housing in a manner so as to be disposed about the path of a finely focused beam of electrons, said eight-fold deflector assembly comprising eight electrically conductive spaced-apart members which are electrically isolated one from the other and annularly arranged around a center axis defining the electron beam path, means for applying deflection electric potentials to the respective members of the eight-fold deflector means for electrostatically deflecting the finely focused electron beam to a desired point on a target plane located at an opposite end of the evacuated housing from the source of the electron beam, and means for applying correction electric potentials to the respective members of the eight-fold deflector means in conjunction with the deflection electric potentials to minimize electron beam spot aberration at the target plane, said means for applying correction electric potentials to the respective members of the eight-fold deflector means comprising means for applying two different quadrupole correction electric potentials to selected ones of the eight-fold deflector members and means for applying an octupole correction electric potential to all eight deflector members.

43. An electron beam tube electrostatic deflection system according to claim 42 wherein said deflector members comprise substantially trapezoidal-shaped members of equal dimension whereby each member occupies an equal proportionate part of the arc of a cross-sectional circle along the axial length of the eight-fold deflector assembly and the assembly is substantially horn-shaped in sectional configuration whereby the outlet end of the assembly is of greater diameter than the inlet end.

44. An electron beam tube electrostatic deflection system according to claim 43 wherein the deflector members are arcuately-shaped with the center axis defining the electron beam path defining the center of the arc of each deflector member.

45. An electron beam tube electrostatic deflection system according to claim 44 wherein the eight-fold deflector members are plate centered with respect to the x and y axes of the projected target plane and the eight-fold deflector members are disposed such that a first deflector member is centered on the x axis and the remaining seven eight-fold deflector members are evenly annularly spaced about the center beam axis defined by the intersection of the x and y axes; the deflection electric potentials applied to the respective eight-fold deflector members starting from the first deflector member are respectively given by the values $V_x$, $a(V_x + V_y)$, $V_y$, $-a(V_x - V_y)$, $-V_x$, $-a(V_x + V_y)$, $-V_y$ and $a(V_x - V_y)$ where a is substantially equal to $\sqrt{2}/2$, $V_x$ is the analog deflection voltage value corresponding to a desired x axis address point on the target plane and $V_y$ is the analog deflection voltage value corresponding to a desired y axis address point on the target plane; and the quadrupole and octupole correction electric potentials applied to one set of four eight-fold deflector members are given respectively by the values $(V_{2c} - \overline{V})$, $(-V_{2c} - \overline{V})$, $(V_{2c} - \overline{V})$ and $(-V_{2c} - \overline{V})$ and the quadrupole and octupole correction potentials applied to the remaining eight-fold deflector members are given respectively by the values $(V_{2s} + \overline{V})$, $(-V_{2s} + \overline{V})$, $(V_{2s} + \overline{V})$ and $(-V_{2s} + \overline{V})$ where the quadrupole correction electric potentials $V_{2c}$ and $V_{2s}$ applied to the said respective sets of four eight-fold deflector members are given by the expression $$V_{2c} = [(A_{2c}(V_x^2 - V_y^2))/V_c]$$

and $$V_{2s} = (2A_{2s} V_x V_y)/V_c$$

and the octupole correction voltage $\overline{V}$ applied to all 8 eight-fold deflector members is given by the expression $$\overline{V} = [A_4(V_x^4 - 6V_x^2 V_y^2 + V_y^4)]/4V_c^3$$

where $A_{2c}$, $A_{2s}$ and $A_4$ are constant and $-V_c$ is the cathode voltage of the electron gun means.

46. An electron beam tube electrostatic deflection system according to claim 44 wherein the eight-fold deflector members are gap-centered with respect to the x and y axes of the projected target plane and are disposed such that the gap between the eighth and the first deflector members is centered on the x axis with the first deflector member being located in the first quadrant and the remaining seven eight-fold deflector members are evenly annularly spaced about the electron beam axis defined by the intersection of the x and y axes and the deflection electric potentials applied to the respective eight-fold deflector members starting from the first deflector are given respectively by the values $(V_x + aV_y)$, $(aV_x + V_y)$, $(-aV_x + V_y)$, $(-V_x + aV_y)$, $(-V_x - aV_y)$, $(-aV_x - V_y)$, $(aV_x - V_y)$ and $(V_x - aV_y)$ where a is substantially equal to $\sqrt{2}-1$, $V_x$ is the analog deflection voltage value corresponding to a desired x axis address point on the target plane and $V_y$ is the analog deflection voltage value corresponding to a desired y axis address point on the target plane; the quadrupole and octupole correction electric potentials applied to the eight-fold deflector members are respectively the values $(V_{2c} + V_{2s} - \overline{V})$, $(-V_{2c} + V_{2s} + \overline{V})$, $(-V_{2c} - V_{2s} - \overline{V})$, $(V_{2c} - V_{2s} + \overline{V})$, $(V_{2c} + V_{2s} - \overline{V})$, $(-V_{2c} + V_{2s} + \overline{V})$, $(V_{2c} - V_{2s} - \overline{V})$ and $(V_{2c} - V_{2s} + \overline{V})$ where $V_{2c}$ is one of the quadrupole correction voltages and is given by the value $$V_{2c} = A_2 [(V_x^2 - V_y^2)/V_c]$$

and $V_{2s}$ is the other quadrupole correction voltage and is given by the value $$V_{2s} = (2A_2 V_x V_y)/V_c$$

and $\overline{V}$ is the octupole correction electric potential applied to all of the eight-fold deflector members and is given by the expression $$\overline{V} = A_4 V_x V_y [(V_x^2 - V_y^2)/V_c^3]$$

and $A_2$ and $A_4$ are constants and $-V_c$ is the cathode voltage of the electron gun means.

47. An electron beam tube electrostatic deflection system according to claim 42 wherein said means for applying deflection electric potentials and said means for applying correction electric potentials to the respective eight-fold deflector members are comprised by eight-fold deflection-correction voltage generator means for generating both the deflection potentials and correction potentials simultaneously and applying the combined deflection and correction potentials to the respective eight-fold deflector members.

48. An electron beam tube electrostatic deflection system according to claim 47 wherein said eight-fold deflector voltage generator means is comprised by respective x and y function generator means for converting the respective x axis and y axis electric address signals to corresponding analog voltages having the values $v_x$, $-v_x$, $v_y$, and $-v_y$, quadrupole-octupole correction voltage generator means responsive at least indirectly to the input x and y axis address signals for deriving the output potentials $\overline{V}$, $-\overline{V}$, $v_{2c}$, $-v_{2c}$, $v_{2s}$ and $-v_{2s}$, "a" ratio multiplier means responsive to the outputs from said x and y functions generator means for deriving the potentials $av_y$, $-av_y$, $av_x$, and $-av_x$, and mixer means comprising a plurality of interconnected summing amplifiers responsive to the outputs from said x and y function generator means, said quadrupole-octupole correction voltage generator means, and said "a" ratio multiplier means for combining and deriving eight different combined deflection and correction electric potentials $v_1$-$v_8$ for application to the respective eight-fold deflector members wherein $$v_1 = v_x + v_{2c} - \overline{v},$$

$$v_2 = av_x + av_y + v_{2s} + \overline{v},$$

$$v_3 = v_y - v_{2c} - \overline{v},$$

$$v_4 = -av_x + av_y - v_{2s} + \overline{v},$$

$$v_5 = -v_x + v_{2c} - \overline{v},$$

$$v_6 = -av_x - av_y + v_{2s} + \overline{v},$$

$$v_7 = -v_y - v_{2c} - \overline{v}$$

and $$v_8 = av_x - av_y - v_{2s} + \overline{v}$$

where "a" is the ratio of the $v_x$ and $v_y$ voltage values applied to the even-numbered deflection members.

49. An electron beam tube electrostatic deflection system according to claim 48 wherein the eight-fold deflector assembly comprises an eight-fold coarse deflector system for a compound fly's-eye type electron beam tube and includes two eight-fold deflector sections with each eight-fold deflector section comprised of eight elemental deflector members annularly arrayed around the center electron beam path and with the elemental deflector members of the first section interconnected electrically with the 180° opposed deflector members of the second section whereby the $v_1$ voltage is amplified to derive the $V_1$ combined deflection and correction potential which is applied to the number 1 eight-fold deflector member of the first section and the number 5 deflector of the second section and similarly the $v_1$, $v_2$, $v_3$, $v_4$, $v_5$, $v_6$, $v_7$, and $v_8$ voltages are amplified to derive the $V_2$, $V_3$, $V_4$, $V_5$, $V_6$, $V_7$ and $V_8$ deflection and correction potentials respectively which are applied to the respective number 2-8 deflector members of the first section and the number 6, 7, 8, 1, 2, 3 and 4 deflector members of the second section, respectively.

50. An electron beam tube electrostatic deflection system according to claim 49 wherein the eight-fold deflector members are plate-centered with respect to the x and y axes of the projected target plane and the eight-fold deflector members are disposed such that a first deflector member is centered on the x axis and is identified as number 1, and the remaining 7 eight-fold deflector members are evenly annularly spaced about the center beam axis defined by the intersection of the x and y axes and are consecutively numbered 2 through 8 in a counter-clockwise direction from the number 1 deflector as viewed in cross section looking toward the target plane; the deflection electric potentials applied to the respective eight-fold deflector members 1–8 starting from number 1 deflector member are respectively given by the values $V_x$, $a(V_x + V_y)$, $V_y$, $-a(V_x - V_y)$, $-V_x$, $-a(V_x + V_y)$, $-V_y$ and $a(V_x - V_y)$ where a is substantially equal to $\sqrt{2/2}$, $V_x$ is the analog deflection voltage value corresponding to a desired x axis address point on the target plane and $V_y$ is the analog deflection voltage value corresponding to a desired y axis address point on the target plane; and the quadrupole and octupole correction electric potentials applied to one set of four eight-fold deflector members comprised by deflector members 1, 3, 5 and 7 are given respectively by the values $(V_{2c} - \overline{V})$, $(-V_{2c} - \overline{V})$, $(V_{2c} - \overline{V})$ and $(-V_{2c} - \overline{V})$ and the quadrupole and octupole correction potentials applied to the remaining number 2, 4, 6 and 8 eight-fold deflector members are given respectively by the values $(V_{2s} + \overline{V})$, $(-V_{2s} + \overline{V})$, $(V_{2s} + \overline{V})$ and $(-V_{2s} + \overline{V})$ where the quadrupole correction electric potentials $V_{2c}$ and $V_{2s}$ applied to the said respective sets of four eight-fold deflector members are given by the expression $$V_{2c} = [A_{2c}(V_x^2 - V_y^2)]/V_c$$

and $$V_{2s} = (2A_{2s} V_x V_y)/V_c$$

and the octupole correction voltage $\overline{V}$ applied to all 8 eight-fold deflector members is given by the expression $$\overline{V} = [A_4(V_x^4 - 6V_x^2 V_y^2 + V_y^4)]/4V_c^3$$

where $A_{2c}$, $A_{2s}$ and $A_4$ are constants and $-V_c$ is the cathode voltage of the electron gun means.

51. An electron beam tube electrostatic deflection system according to claim 50 further including "b" factor multiplying means interposed in the interconnection to the second section of the eight-fold coarse deflector means for multiplying the voltages applied to the second section eight-fold deflector members by an adjustable factor "b" prior to application to the second section deflector members for fine tuning the eight-fold coarse deflector system.

52. An electron beam tube electrostatic deflection system according to claim 51 further including nonlinear, field distortion correction voltage generator means included with said means for applying correction electric potentials to the respective members for linearizing the actual x and y axis deflection of the electron beam to cause the deflection to be linearly proportional to the x and y addresses.

53. An electron beam tube electrostatic deflection system according to claim 50 further including nonlinear, field distortion correction voltage generator means included with said means for applying correction electric potentials to the respective members for linearizing the actual x and y axis deflection of the electron beam to cause the deflection to be linearly proportional to the x and y addresses.

54. An electron beam tube electrostatic deflection system according to claim 48 further including nonlinear, field distortion correction voltage generator means included with said means for applying correction electric potentials to the respective members for linearizing the actual x and y axis deflection of the electron beam to cause the deflection to be linearly proportional to the x and y addresses.

55. An electron beam tube electrostatic deflection system according to claim 47 wherein said eight-fold deflector voltage generator means is comprised by respective x and y function generator means for converting the respective x axis and y axis electric address signals to corresponding analog voltages having the values $v_x$, $-v_x$, $v_y$, and $-v_y$, quadrupole-octupole correction voltage generator means responsive at least indirectly to the input x and y axis address signals for deriving the output potentials $\overline{V}$, $-\overline{V}$, $v_{2c}$, $-v_{2c}$, $v_{2s}$ and $-v_{2s}$, "a" ratio multiplier means responsive to the outputs from said x and y functions generator means for deriving the potentials $av_y$, $-av_y$, $av_x$, and $-av_x$, and mixer means comprising a plurality of interconnected summing amplifiers responsive to the outputs from said x and y function generator means, said quadrupole-octupole correction voltage generator means, and said "a" ratio multiplier means for combining and deriving eight different combined deflection and correction electric potentials $v_1$–$v_8$ for application to the respective eight-fold deflector members wherein $v_1 = v_x + av_y + v_{2c} + v_{2s} - \overline{V}$,
$v_2 = av_x + v_y - v_{2c} + v_{2s} + \overline{V}$,
$v_3 = -av_x + v_y - v_{2c} - v_{2s} - \overline{V}$,
$v_4 = -v_x + av_y + v_{2c} - v_{2s} + \overline{V}$,
$v_5 = -v_x - av_y + v_{2c} + v_{2s} - \overline{V}$,
$v_6 = -av_x - v_y - v_{2c} + v_{2s} + \overline{V}$,
$v_7 = av_x - v_y - v_{2c} - v_{2s} - \overline{V}$ and
$v_8 = v_x - av_y + v_{2c} - v_{2s} + \overline{V}$ where "a" is the ratio of the $v_x$ voltage values applied to the y-deflection members and $v_y$ voltage applied to the x-deflection members.

56. An electron beam tube electrostatic deflection system according to claim 55 wherein the eight-fold deflector assembly comprises an eight-fold coarse deflector system for a compound flys-eye type electron beam tube and includes two eight-fold deflector sections with each eight-fold deflector section comprised of eight elemental deflector members annularly arrayed around the center electron beam path and with the elemental deflector members of the first section interconnected electrically with the 180° opposed deflector members of the second section whereby the $V_1$ voltage is amplified to derive the $V_1$ combined deflection and correction potential which is applied to the number 1 eight-fold deflector member of the first section and the number 5 deflector of the second section and similarly the $v_1, v_2, v_3, v_4, v_5, v_6, v_7$, and $v_8$ voltages are amplified to derive the $V_2, V_3, V_4, V_5, V_6, V_7$ and $V_8$ deflection and correction potentials respectively which are applied to the respective number 2-8 deflector members of the first section and the number 6, 7, 8, 1, 2, 3 and 4 deflector members of the second section, respectively.

57. An electron beam tube electrostatic deflection system according to claim 56 wherein the eight-fold deflector members are gap-centered with respect to the x and y axes of the projected target plane and are disposed such that the gap between the eighth and the first deflector members is centered on the x axis with the first deflector member being located in the first quadrant and the remaining seven eight-fold deflector members are evenly annularly spaced about the electron beam axis defined by the intersection of the x and y axes and the deflection electric potentials applied to the respective eight-fold deflector members starting from the first deflector are given respectively by the values $(V_x + aV_y), (aV_x + V_y), (-aV_x + V_y), (-V_x + aV_y), (-V_x - aV_y), (-aV_x - V_y), (aV_x - V_y)$ and $(V_x - aV_y)$ where a is substantially equal to $\sqrt{2}-1$, $V_x$ is the analog deflection voltage value corresponding to a desired x axis address point on the target plane and $V_y$ is the analog deflection voltage value corresponding to a desired y axis address point on the target plane; the quadrupole and octupole correction electric potentials applied to the eight-fold deflector members are respectively the values $(V_{2c} + V_{2s} - \overline{V}), (-V_{2c} + V_{2s} + \overline{V}), (-V_{2c} - V_{2s} - \overline{V}), (V_{2c} - V_{2s} + \overline{V}) (V_{2c} + V_{2s} - \overline{V}), (-V_{2c} + V_{2s} + \overline{V}), (-V_{2c} - V_{2s} - \overline{V})$ and $(V_{2c} - V_{2s} + \overline{V})$ where $V_{2c}$ is one of the quadrupole correction voltages and is given by the value $$V_{2c} = A_2 [V_x^2 - V_y^2]/V_c]$$

and $V_{2s}$ is the other quadrupole correction voltage and is given by the value $$V_{2s} = (2A_2 V_x V_y)/V_c$$

and $\overline{V}$ is the octupole correction electric potential applied to all of the eight-fold deflector members and is given by the expression $$\overline{V} = A_4 V_x V_y [(V_x^2 - V_y^2)/V_c^3]$$

and $A_2$ and $A_4$ are constants and $-V_c$ is the cathode voltage of the electron gun means.

58. An electron beam tube electrostatic deflection system according to claim 57 further including "b" factor multiplying means interposed in the interconnection to the second section of the eight-fold coarse deflector means for multiplying the voltages applied to the second section eight-fold deflector members by an adjustable factor "b" prior to application to the second section deflector members for fine tuning the eight-fold coarse deflector system.

59. An electron beam tube electrostatic deflection system according to claim 58 further including nonlinear, field distortion correction voltage generator means included with said means for applying correction electric potentials to the respective members for linearizing the actual x and y axis deflection of the electron beam to cause the deflection to be linearly proportional to the x and y addresses.

60. An electron beam tube electrostatic deflection system according to claim 57 further including nonlinear, field distortion correction voltage generator means included with said means for applying correction electric potentials to the respective members for linearizing the actual x and y axis deflection of the electron beam to cause the deflection to be linearly proportional to the x and y addresses.

61. An electron beam tube electrostatic deflection system according to claim 55 further including nonlinear, field distortion correction voltage generator means included with said means for applying correction electric potentials to the respective members for linearizing the actual x and y axis deflection of the electron beam to cause the deflection to be linearly proportional to the x and y addresses.

62. A charged particle beam tube electrostatic deflection system comprising an evacuated housing, gun means disposed at one end of the evacuated housing for producing a beam of charged particles, lens means secured within the evacuated housing intermediate the gun means and the opposite end of the housing and disposed along the path of the beam of charged particles for focusing and centering the beam of charged particles into a finely focused pencil-like beam of charged particles, eight-fold deflector means secured within the housing and disposed about the path of the finely focused beam of charged particles, said eight-fold deflector means comprising eight electrically conductive spaced-apart members which are electrically isolated one from the other and annularly arranged around the center charged particle beam path, means for applying deflection electric potentials to the respective members of the eight-fold deflector means for electrostatically deflecting the finely focused charged particle beam to a desired point on a target plane located at an opposite end of the evacuated housing from the electron gun means, and means for applying correction electric potentials to the respective members of the eight-fold deflector means in conjunction with the deflection electric potentials to minimize charged particle beam spot aberration at the target plane, said means for applying correction electric potentials to the respective members of the eight-fold deflector means comprising means for applying two different quadrupole correction electric potentials to respective ones of the eight-fold deflector members and means for applying an octupole correction electric potential to all eight deflector members.

63. A charged particle beam tube electrostatic deflection system comprising an eight-fold deflector assembly for securement within an evacuated housing in a manner so as to be disposed about the path of a finely focused beam of charged particles, said eight-fold deflector assembly comprising eight electrically conductive spaced-apart members which are electrically isolated one from the other and annularly arranged around a center axis defining the charged particle beam path, means for applying deflection electric potentials to the respective members of the eight-fold deflector means for electrostatically deflecting the finely focused charged particle beam to a desired point on a target plane located at an opposite end of the evacuated housing from the source of the charged particle beam, and means for applying correction electric potentials to the respective members of the eight-fold deflector means in conjunction with the deflection electric potentials to minimize charged particle beam spot aberration at the target plane, said means for applying correction electric potentials to the respective members of the eight-fold deflector means comprising means for applying two different quadrupole correction electric potentials to selected ones of the eight-fold deflector members and means for applying an octupole correction electric potential to all eight deflector members.

* * * * *